(12) United States Patent
Kang et al.

(10) Patent No.: US 12,471,452 B2
(45) Date of Patent: Nov. 11, 2025

(54) DISPLAY APPARATUS AND METHOD OF MANUFACTURING THE SAME

(71) Applicant: Samsung Display Co., Ltd., Yongin-Si (KR)

(72) Inventors: Yeeun Kang, Yongin-si (KR); Kwangsoo Lee, Yongin-si (KR); Seulki Kim, Yongin-si (KR); Seungrae Kim, Yongin-si (KR); Hyun Kim, Yongin-si (KR); Seungha Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 473 days.

(21) Appl. No.: 18/103,901

(22) Filed: Jan. 31, 2023

(65) Prior Publication Data
US 2023/0371316 A1 Nov. 16, 2023

(30) Foreign Application Priority Data

May 16, 2022 (KR) .................. 10-2022-0059832
May 27, 2022 (KR) .................. 10-2022-0065596

(51) Int. Cl.
*H10K 59/123* (2023.01)
*H10K 59/12* (2023.01)
*H10K 59/122* (2023.01)
*H10K 71/00* (2023.01)

(52) U.S. Cl.
CPC ....... *H10K 59/123* (2023.02); *H10K 59/1201* (2023.02); *H10K 59/122* (2023.02); *H10K 71/00* (2023.02)

(58) Field of Classification Search
None
See application file for complete search history.

(56) References Cited

U.S. PATENT DOCUMENTS

| | | |
|---|---|---|
| 9,029,844 B2 | 5/2015 | Choi et al. |
| 9,530,989 B2 | 12/2016 | Kim et al. |
| 10,141,348 B2 | 11/2018 | Kim et al. |

(Continued)

FOREIGN PATENT DOCUMENTS

| | | | | |
|---|---|---|---|---|
| EP | 3447808 A1 | * | 2/2019 | ........... H10H 20/831 |
| KR | 10-2014-0058745 A | | 5/2014 | |

(Continued)

*Primary Examiner* — Michael Lebentritt
(74) *Attorney, Agent, or Firm* — Innovation Counsel LLP

(57) ABSTRACT

Provided are a display device and a method of manufacturing the display device. The display device includes a substrate, a transistor, a first electrode connected with the transistor, a bank layer covering an edge of the first electrode, including an opening overlapping the first electrode, and a first insulating layer, wherein a top surface of the first electrode includes a first surface portion overlapping the opening of the bank layer, a second surface portion having a vertical distance from the substrate smaller than a vertical distance of the first surface portion from the substrate, a first slope portion between the first surface portion and the second surface portion, the first slope portion inclined downward with respect to the first surface portion, and a second slope portion between the first slope portion and the second surface portion, the second slope portion inclined downward from the edge of the first electrode.

20 Claims, 25 Drawing Sheets

(56) References Cited

U.S. PATENT DOCUMENTS

| | | | | |
|---|---|---|---|---|
| 2002/0180371 | A1* | 12/2002 | Yamazaki | H10K 59/873 |
| | | | | 315/169.3 |
| 2021/0066643 | A1 | 3/2021 | Choi et al. | |
| 2022/0254864 | A1* | 8/2022 | Lee | H10K 59/122 |
| 2024/0023413 | A1* | 1/2024 | Kim | H10K 59/1201 |
| 2024/0324345 | A1* | 9/2024 | Shin | H10K 59/124 |

FOREIGN PATENT DOCUMENTS

| | | | | |
|---|---|---|---|---|
| KR | 10-1928582 B1 | | 12/2018 | |
| KR | 20200082582 A | * | 7/2020 | H10K 59/88 |
| KR | 20210014233 A | * | 2/2021 | H10K 50/805 |
| KR | 10-2021-0028799 A | | 3/2021 | |
| KR | 20230033058 A | * | 3/2023 | H10D 86/0231 |
| KR | 20240144678 A | * | 10/2024 | H10K 59/873 |
| TW | 202327084 A | * | 7/2023 | H10H 20/857 |
| WO | WO-2024189456 A1 | * | 9/2024 | H10D 30/67 |

* cited by examiner

DISPLAY APPARATUS AND METHOD OF MANUFACTURING THE SAME

CROSS-REFERENCE TO RELATED APPLICATIONS

This application is based on and claims priority under 35 U.S.C. § 119 to Korean Patent Application No. 10-2022-0059832 filed on May 16, 2022 and Korean Patent Application No. 10-2022-0065596 filed on May 27, 2022 in the Korean Intellectual Property Office, the disclosures of which are incorporated by reference herein in their entireties.

BACKGROUND

1. Field

One or more embodiments relate to a display device and a method of manufacturing the display device.

2. Description of the Related Art

Development of various electronic devices such as mobile phones, personal digital assistants (PDA), computers, and large-size televisions, is accompanied by development of various kinds of display devices that support those electronic devices. For example, display devices in wide commercial use include liquid display devices including backlight units and organic light-emitting display devices having color areas respectively emitting lights of different colors. Display devices including quantum dot color conversion layers (QD-CCL) are also under development.

Generally, organic light-emitting display devices include sub-pixel circuits and organic light-emitting diodes on substrates, with the sub-pixel circuits including thin-film transistors, and operate as the organic light-emitting diodes emit light. In a process of forming sub-pixel circuits and organic light-emitting diodes on substrates, several photolithography processes using a mask may be used. A photolithography process includes a series of processes of transferring a pattern on a mask to a substrate, on which a thin film such as a metal layer, an organic layer, or an inorganic layer is deposited, to form a desired pattern on the thin film. A photolithography process includes photoresist coating, exposure, development, and the like.

Recently, display devices are used for various purposes. In addition, due to the decrease in thicknesses and weights of display devices, display devices have been more widely used. Recently, there has been various design attempts to improve the quality of display devices.

SUMMARY

In one aspect, the disclosure pertains to a display device in which defects of light-emitting devices may be prevented by reducing the number of masks used in a manufacturing process, and a method of manufacturing the display device. However, the scope of the disclosure is not limited thereto.

Additional aspects will be set forth in part in the description which follows and, in part, will be apparent from the description, or may be learned by practice of the presented embodiments of the disclosure.

A display device includes a substrate including a display area and a peripheral area outside the display area, a thin-film transistor arranged in the display area, and including a semiconductor layer and a gate electrode on the semiconductor layer, a first electrode electrically connected to the thin-film transistor, a bank layer covering an edge of the first electrode and having an opening overlapping the first electrode, a second electrode on the first electrode, an emission layer between the first electrode and the second electrode, and a first insulating layer between the thin-film transistor and the first electrode, wherein a top surface of the first insulating layer includes a first surface portion overlapping the opening of the bank layer, a second surface portion having a vertical distance from the substrate smaller than a vertical distance from the surface to the first surface portion, a first slope portion between the first surface portion and the second portion, the first slope portion being inclined downward with respect to the first surface portion, a second slope portion between the first slope portion and the second portion, the second slope portion being inclined downward from the edge of the first electrode.

An angle of the first slope portion with respect to a top surface of the substrate may be less than an angle of the second slope portion with respect to the top surface of the substrate.

The first insulating layer may include a valley portion arranged along the edge of the first electrode and around the first electrode.

The second slope portion may include a side surface of the valley portion.

The first insulating layer may further include a third surface portion arranged between the first slope portion and the second slope portion, the third surface portion overlapping the first electrode.

A vertical distance from a top surface of a portion of the first electrode corresponding to the first slope portion to a top surface of the bank layer may increase toward the edge of the first electrode.

The first insulating layer may include an opening corresponding to the peripheral area.

The semiconductor layer may include an oxide semiconductor material.

The display device may further include an upper electrode overlapping and electrically connected with a source area and a drain area of the semiconductor layer, the gate electrode may overlap a channel area of the semiconductor layer, and the upper electrode may be on a same layer as the gate electrode.

In an embodiment, the display device may further include an inorganic insulating layer covering the gate electrode and the upper electrode, and the first electrode may directly contact the electrode via a contact hole through the inorganic insulating layer and the first insulating layer.

In another aspect, a method of manufacturing a display device includes preparing a substrate including a display area and a peripheral area outside the display area, forming a thin-film transistor on the display area, forming, on the thin-film transistor by using a mask, a first insulating layer having a top surface including a first surface portion and a first slope portion inclined downward with respect to the first surface portion, by using a mask, forming a first electrode on the insulating layer, forming a second surface portion having a vertical distance from the substrate smaller than a vertical distance from the surface to the first surface portion, forming a second slope portion between the first slope portion and the second surface portion, removing a portion of the first insulating layer to form a bank layer covering an edge of the first electrode and having an opening overlapping the first surface portion, forming a second slope portion between the first slope portion and the second surface portion, by removing a portion of the first insulating layer, forming a bank layer covering an edge of the first electrode and having an opening aligned with the first surface portion; forming an emission layer on the first electrode, and forming a second electrode on the emission layer, wherein the first slope portion is between the first surface portion and the second surface portion.

The mask may include a half tone mask or a slit mask.

The second slope portion may be inclined downward from the edge of the first electrode.

The first slope portion and the second slope portion may be formed in separate processes.

The second slope portion may be formed simultaneously with the second surface portion.

The forming of the second surface portion may include an ashing process.

The method may further include removing a portion of the first insulating layer from the peripheral area.

The method may further include forming a valley portion arranged along the edge of the first electrode and around the first electrode, by removing a portion of the first insulating layer.

The forming of the valley of the first insulating layer may be simultaneously performed with the forming of the second surface portion.

An angle of the first slope portion with respect to the top surface of the substrate may be less than an angle of the second slope portion with respect to the top surface of the substrate.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
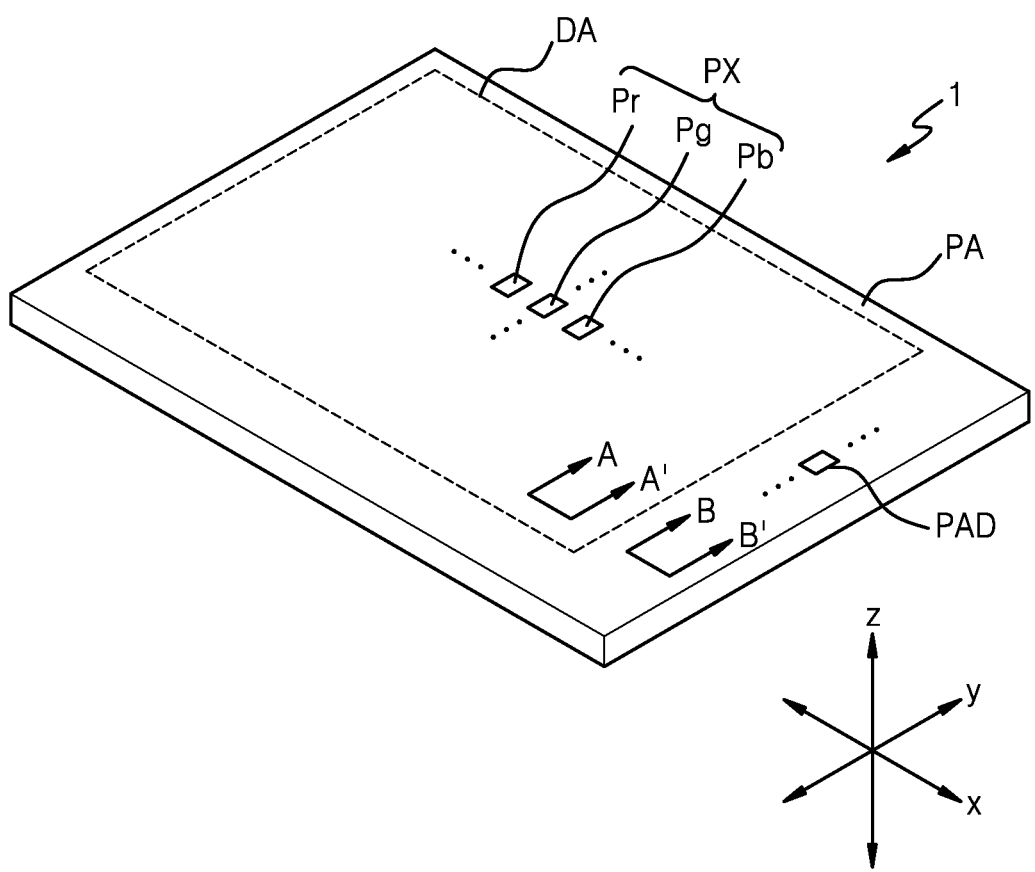
FIG. 1 is a schematic perspective view of a display device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows various modifications and may have various embodiments, specific embodiments will be illustrated in the drawings and described in detail in the detailed descriptions. Effects and features of the disclosure and methods of accomplishing the same will be clearly understood with reference to the embodiments described in detail in conjunction with the drawings. However, the disclosure is not limited to the embodiments disclosed hereinafter and may be embodied in various forms.

In following embodiments, terms such as first and second are used to distinguish one component from others, and are not used in a limited sense.

In following embodiments, unless clearly indicated otherwise, singular forms also include plural forms.

In following embodiments, terms such as "include" or "comprise" indicate existence of features or components disclosed in the specification, and are not to preclude the possibility of addition of one or more of other features or components.

In following embodiments, when it is mentioned that a portion such as a film, area, and component is on or above another portions, the portion may be directly on the other portion, or intervening portions may be present therebetween.

Sizes of components in the drawings may be exaggerated or reduced for convenience of explanation. For example, as sizes and thicknesses of components in the drawings are arbitrarily illustrated for convenience of explanation, the disclosure is not limited thereto.

In the present specification, "A and/or B" indicates A, B, or A and B. Also, in the present specification, "at least one of A and B" indicates, A, B, or A and B.

In following embodiments, "extension in a first direction or a second direction" of wirings includes extending in a zig-zag shape or a curved shape in the first direction or the second direction, as well as extension in a straight shape.

In following embodiments, "on a top-plan view" indicates when a subject portion is seen from top, and "on a cross-sectional view" indicates when a cross-section of the subject portion is seen from a side. In following embodiments, "overlap" includes overlapping "on a top plan view" and "on a cross-sectional view."

Hereinafter, embodiments of the disclosure will be described in detail with reference to the accompanying drawings, and in the description with reference to the drawings, same reference numerals will be given to same or corresponding components.

FIG. 1 is a schematic perspective view of a display device according to an embodiment.

Referring to FIG. 1, a display device 1 may include a display area DA and a peripheral area PA outside the display area DA. The display device 1 may provide an image through an array of a plurality of sub-pixels PX two-dimensionally arranged on an x-y plane in the display area DA. The sub-pixels PX include a first sub-pixel, a second sub-pixel, and a third sub-pixel. Hereinafter, for convenience of explanation, a case in which the first sub-pixel includes a red sub-pixel Pr, the second sub-pixel includes a green sub-pixel Pg, and the third sub-pixel includes a blue sub-pixel Pb will be described.

The red sub-pixel Pr, the green sub-pixel Pg, and the blue sub-pixel Pb are areas from which red light, green light, and blue light may respectively be emitted, and the display device 1 may provide an image using light emitted from the sub-pixels PX.

The peripheral area PA may be an area that does not provide an image, and may completely or partially surround the display area DA. A pad portion PAD may be arranged in the peripheral area PA. Various wirings configured to provide electric signals or power to sub-pixel circuits, a printed circuit board, or a driver integrated circuit (IC) chip may be attached onto the pad portion PAD.

As shown in FIG. 1, the display area DA may have a polygonal shape, such as a rectangular shape. For example, the display area DA may have a rectangular shape in which a length in y-direction is greater than a length in x-direction, a rectangular shape in which a length in y-direction is smaller than a length in x-direction, or a square shape. Alternatively, the display area DA may have various shapes such as an oval or a circle.

Figure 2:
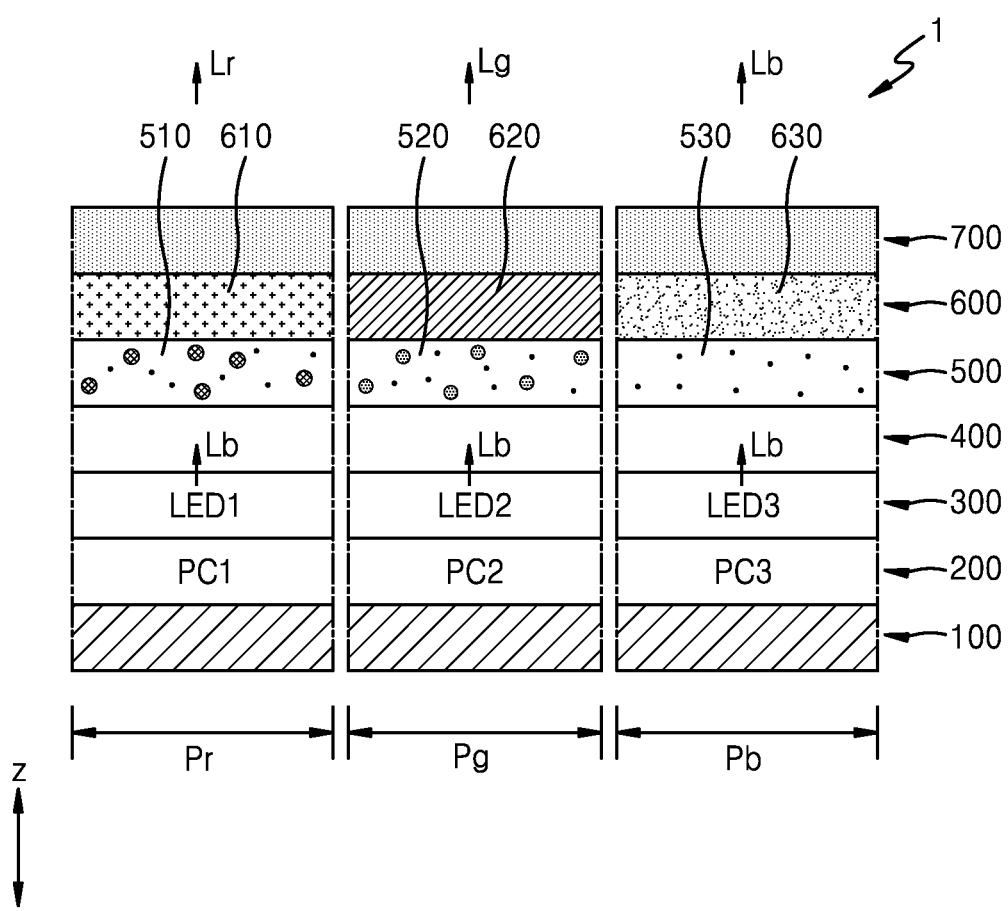
FIG. 2 is a schematic cross-sectional view of a display device according to an embodiment.

FIG. 2 is a schematic cross-sectional view of sub-pixels of the display device according to an embodiment.

Referring to FIG. 2, the display device 1 may include a circuit layer 200 on a substrate 100. The circuit layer 200 may include a first sub-pixel circuit PC1, a second sub-pixel circuit PC2, and a third sub-pixel circuit PC3, and the first sub-pixel circuit PC1, the second sub-pixel circuit PC2, and the third sub-pixel circuit PC3 may be respectively connected to a first light-emitting diode LED1, a second light-emitting diode LED2, and a third light-emitting diode LED3 of a light-emitting diode layer 300.

The first light-emitting diode LED1, the second light-emitting diode LED2, and the third light-emitting diode LED3 may include an organic light-emitting diode including an organic material. According to another embodiment, the first light-emitting diode LED1, the second light-emitting diode LED2, and the third light-emitting diode LED3 may include an inorganic light-emitting diode including an inorganic material. The inorganic light-emitting diode may include a PN junction diode including materials based on inorganic semiconductors. When a voltage is applied to the PN junction diode in a positive direction, holes and electrons are injected into the PN junction diode, and energy generated by the recombination of the holes and electrons is converted into light energy, and thus, light of a certain color is emitted. The inorganic light-emitting diode may have a width of about several to hundreds of micrometers or several or hundreds of nanometers. In some embodiments, the first light-emitting diode LED1, the second light-emitting diode LED2, and the third light-emitting diode LED3 may include light-emitting diodes including quantum dots. As described above, light-emitting layers of the first light-emitting diode LED1, the second light-emitting diode LED2, and the third light-emitting diode LED3 may include organic materials, inorganic materials, or quantum dots, or may include organic materials and quantum dots, or may include inorganic materials and quantum dots. Hereinafter, the first light-emitting diode LED1, the second light-emitting diode LED2, and the third light-emitting diode LED3 are described on the premise of being organic light-emitting diodes.

The first light-emitting diode LED1, the second light-emitting diode LED2, and the third light-emitting diode LED3 may emit light having a same color. For example, light (for example, blue light Lb) emitted from the first light-emitting diode LED1, the second light-emitting diode LED2, and the third light-emitting diode LED3 may pass through a functional layer 500 via an encapsulation layer 400 on the light-emitting diode layer 300.

The functional layer 500 may include optical units configured to transmit light (for example, the blue light Lb) emitted from the light-emitting diode layer 300 with or without color conversion. For example, the functional layer 500 may include color converters configured to convert the light (for example, the blue light Lb) emitted from the light-emitting diode layer 300 to light having other colors, and a transmitter configured to transmit the light (for example, the blue light Lb) emitted from the light-emitting diode layer 300 without color conversion. The functional layer 500 may include a first color converter 510 corresponding to the red sub-pixel Pr, a second color converter 520 corresponding to the green sub-pixel Pg, and a transmitter 530 corresponding to the blue sub-pixel Pb. The first color converter 510 may convert the blue light Lb into red light Lr, and the second color converter 520 may convert the blue light Lb into green light Lg. The transmitter 530 may transmit the blue light Lb without conversion.

A color layer 600 may be disposed on the functional layer 500. The color layer 600 may include a first color filter 610, a second color filter 620, and a third color filter 630 respectively having different colors. For example, the first color filter 610 may include a red color filter, the second color filter 620 may include a green color filter, and the third color filter 630 may include a blue color filter.

Color purities of the light color-converted by the functional layer 500 and the light transmitted by the functional layer 500 may be improved through the first color filter 610, the second color filter 620, and the third color filter 630. In addition, the color layer 600 may prevent or minimize external light (for example, light incident to the display device 1 from outside the display device 1) from being reflected to be recognized by a user.

The display device 1 may further include a light-transmitting base layer 700 on the color layer 600. The light-transmitting base layer 700 may include glass or a light-transmitting organic material. For example, the light-transmitting base layer 700 may include a light-transmitting organic material such as an acrylic resin.

According to an embodiment, the light-transmitting base layer 700 is a kind of substrate, and after the color layer 600 and the functional layer 500 are formed on the light-transmitting base layer 700, the light-transmitting base layer 700 may be integral with the encapsulation layer such that the functional layer 500 faces the encapsulation layer.

According to another embodiment, after the functional layer 500 and the color layer 600 are sequentially formed on the encapsulation layer 400, the light-transmitting base layer 700 may be formed by being directly coated and cured on the color layer 600.

In some embodiments, other optical films such as an anti-reflection (AR) film may be disposed on the light-transmitting base layer 700.

The display device 1 having the aforementioned structure may include an electronic device capable displaying video images or still images, for example, a television, a billboard, a screen for theaters, a monitor, a tablet PC, a notebook, and the like.

Figure 3:
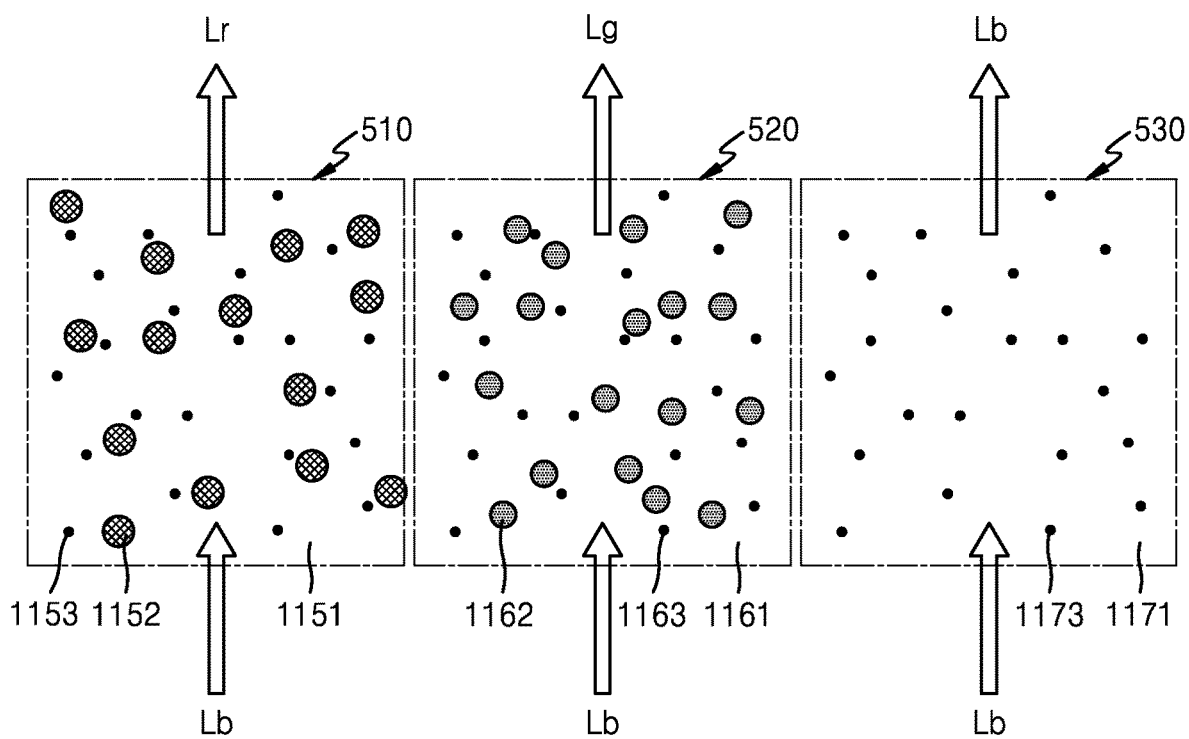
FIG. 3 illustrates optical layers of a functional layer shown in FIG. 2.

FIG. 3 illustrates optical units of the functional layer 500 shown in FIG. 2.

Referring to FIG. 3, the first color converter 510 may convert the blue light Lb, which is incident to the first color converter 510, into the red light Lr. As shown in FIG. 3, the first color converter 510 may include a first photosensitive polymer 1151, and first quantum dots 1152 and first scattering particles 1153 dispersed in the first photosensitive polymer 1151.

The first quantum dots 1152 may be excited by the blue light Lb to isotopically emit the red light Lr having a wavelength greater than a wavelength of the blue light Lb. The first photosensitive polymer 1151 may include an organic material having light transmissivity. The first scattering particles 1153 may scatter the blue light Lb that has not been absorbed by the first quantum dots 1152 to excite more of the first quantum dots 1152, and thus, the efficiency of color conversion is increased. The first scattering particles 1153 may include, for example, titanium dioxide ($TiO_2$) particles or metal particles. The first quantum dots 1152 may be selected from among a Group II-VI compound, a Group III-V compound, a Group IV-VI compound, a Group IV element, a Group IV compound, and combinations thereof.

The second color converter 520 may convert the blue light Lb, which is incident to the second color converter 520, into the green light Lg. As shown in FIG. 3, the second color converter 520 may include a second photosensitive polymer 1161, and second quantum dots 1162 and second scattering particles 1163 dispersed in the second photosensitive polymer 1161.

The second quantum dots 1162 may be excited by the blue light Lb to isotopically emit the green light Lg having a wavelength greater than a wavelength of the blue light Lb. The second photosensitive polymer 1161 may include an organic material having light transmissivity.

The second scattering particles 1163 may scatter the blue light Lb that has not been absorbed by the second quantum dots 1162 to excite more of the second quantum dots 1162, to thereby increase the efficiency of color conversion. The second scattering particles 1163 may include, for example, titanium dioxide ($TiO_2$) particles or metal particles. The second quantum dots 1162 may be selected from among a Group II-VI compound, a Group III-V compound, a Group IV-VI compound, a Group IV element, a Group IV compound, and combinations thereof.

The transmitter 530 may transmit the received blue light Lb without color conversion. As shown in FIG. 3, the transmitter 530 may include a third photosensitive polymer 1171 in which third scattering particles 1173 are dispersed. The third photosensitive polymer 1171 may include an organic material having light transmissivity, for example, silicon resin and epoxy resin, and may include a same material as those of the first photosensitive polymer 1151 and the second photosensitive polymer 1161. The third scattering particles 1173 may scatter and emit the blue light Lb, and may include a same material as those of the first scattering particles 1153 and the second scattering particles 1163.

Figure 4:
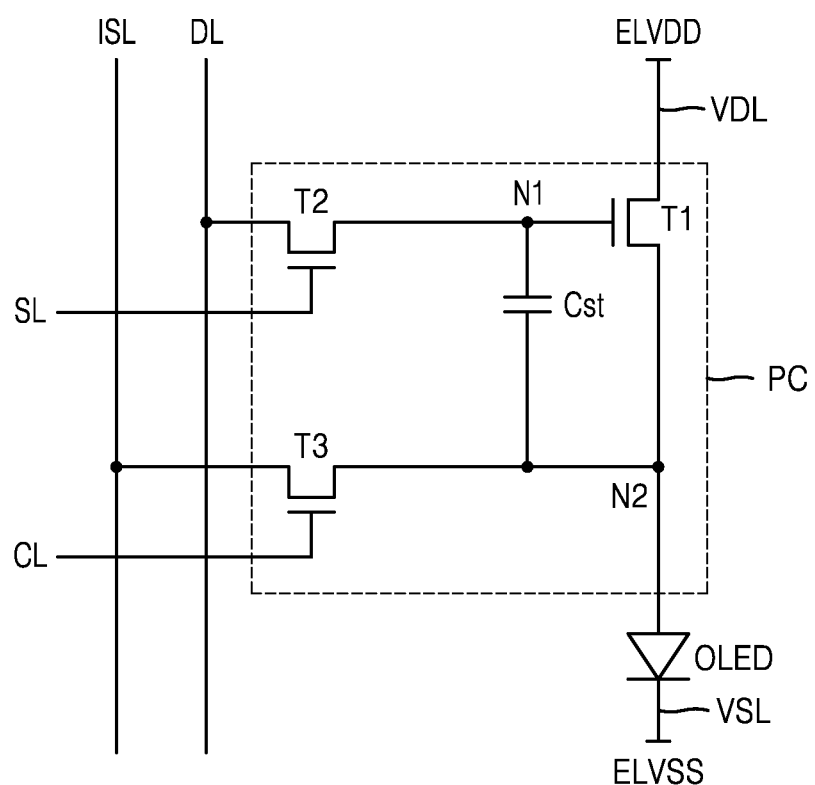
FIG. 4 is an equivalent circuit diagram of a sub-pixel circuit electrically connected to a light-emitting diode of a display device according to an embodiment.

FIG. 4 is an equivalent circuit diagram of a light-emitting diode included in a display device according to an embodiment and a sub-pixel circuit electrically connected to the light-emitting diode. Sub-pixels PC shown in FIG. 4 correspond to the first sub-pixel circuit PC1, the second sub-pixel circuit PC2, and the third sub-pixel circuit PC3 described above with reference to FIG. 2, and an organic light-emitting diode OLED shown in FIG. 4 may correspond to the first light-emitting diode LED1, the second light-emitting diode LED2, and the third light-emitting diode LED3 described above with reference to FIG. 2.

Referring to FIG. 4, a first electrode (for example, an anode) of the organic light-emitting diode OLED may be connected to the sub-pixel circuit PC, and a second electrode (for example, a cathode) of the organic light-emitting diode OLED may be connected to a common voltage line VSL configured to provide a common voltage ELVSS. The organic light-emitting diode OLED may emit light at a luminance corresponding to the level of current provided from the sub-pixel circuit PC.

The sub-pixel circuit PC may control an amount of current flowing from a driving voltage ELVDD to the common voltage ELVSS via the organic light-emitting diode OLED, in response to a data signal. The sub-pixel circuit PC may include a first thin-film transistor T1, a second thin-film transistor T2, a third thin-film transistor T3, and a storage capacitor Cst.

Each of the first thin-film transistor T1, the second thin-film transistor T2, and the third thin-film transistor T3 may include an oxide semiconductor transistor including a semiconductor layer including an oxide semiconductor, or may include a silicon semiconductor transistor including a semiconductor layer including polysilicon. According to the type of the thin-film transistors, a first electrode may include one of a source electrode and a drain electrode, and a second electrode may include another one of the source electrode and the drain electrode.

A first electrode of the first thin-film transistor T1 may be connected to a driving voltage line VDL configured to provide the driving voltage ELVDD, and a second electrode of the first thin-film electrode T1 may be connected to a first electrode of the organic light-emitting diode OLED. A gate electrode of the first thin-film transistor T1 may be connected to a first node N1. The first thin-film transistor T1 may control an amount of current flowing from the driving voltage ELVDD through the organic light-emitting diode OLED, in response to a voltage of the first node N1.

The second thin-film transistor T2 may include a switching transistor. A first electrode of the second thin-film transistor T2 may be connected to a data line DL, and a second electrode of the second thin-film transistor T2 may be connected to the first node N1. A gate electrode of the second thin-film transistor T2 may be connected to a scan line SL. The second thin-film transistor T2 may be turned on when a scan signal is provided to the scan line SL to electrically connect the data line DL with the first node N1.

The third thin-film transistor T3 may include an initialization transistor and/or a sensing transistor. A first electrode of the third thin-film transistor T3 may be connected to a second node, and a second electrode of the third thin-film transistor T3 may be connected to a sensing line ISL. A gate electrode of the third thin-film transistor T3 may be connected to a control line CL.

The storage capacitor Cst may be connected between the first node N1 and the second node N2. For example, a first capacitor electrode of the storage capacitor may be connected to the gate electrode of the first thin-film transistor T1, and a second capacitor electrode of the storage capacitor Cst may be connected to the first electrode of the organic light-emitting diode OLED.

Although FIG. 4 illustrates the first thin-film transistor T1, the second thin-film transistor T2, and the third thin-film transistor T3 as n-channel metal oxide semiconductor (NMOS) transistors, the embodiments are not limited thereto. For example, at least one of the first thin-film transistor T1, the second thin-film transistor T2, and the third thin-film transistor T3 may include a p-channel metal oxide semiconductor (PMOS) transistor.

Although FIG. 4 illustrates three thin-film transistors and one storage capacitor, the disclosure is not limited thereto. The sub-pixel circuit PC may include at least four thin-film transistors and/or at least two storage capacitors. According to an embodiment, the sub-pixel circuit PC may include seven thin-film transistors and one storage capacitor.

Figure 5:
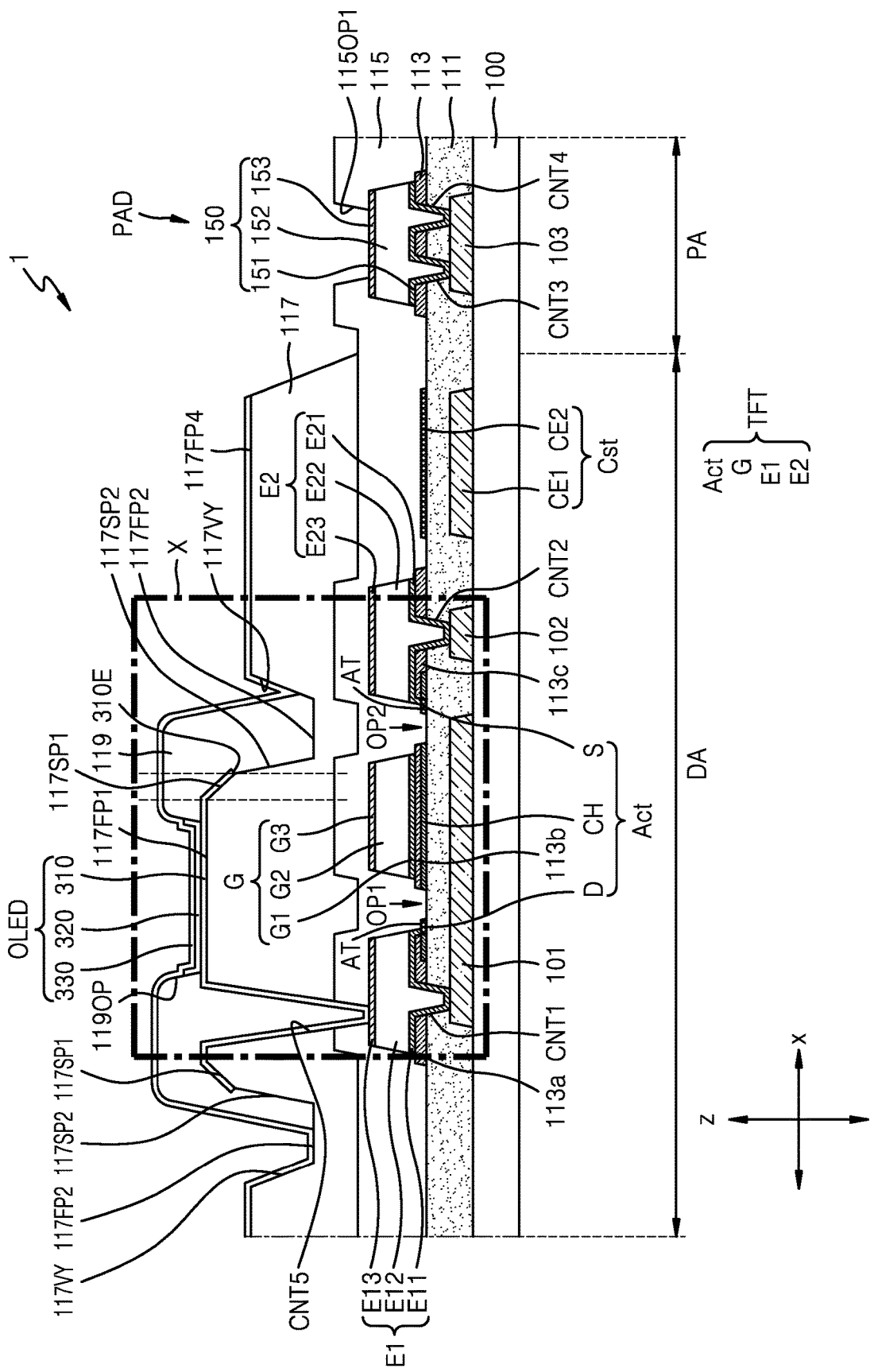
FIG. 5 is a schematic cross-sectional view of a display device according to an embodiment.
Figure 6:
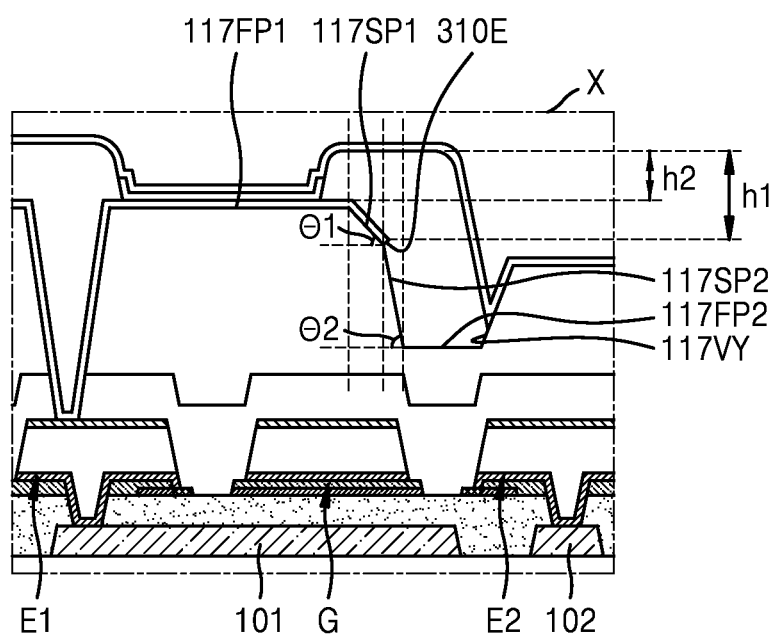
FIG. 6 is a schematic cross-sectional view of a display device according to an embodiment.
Figure 7:
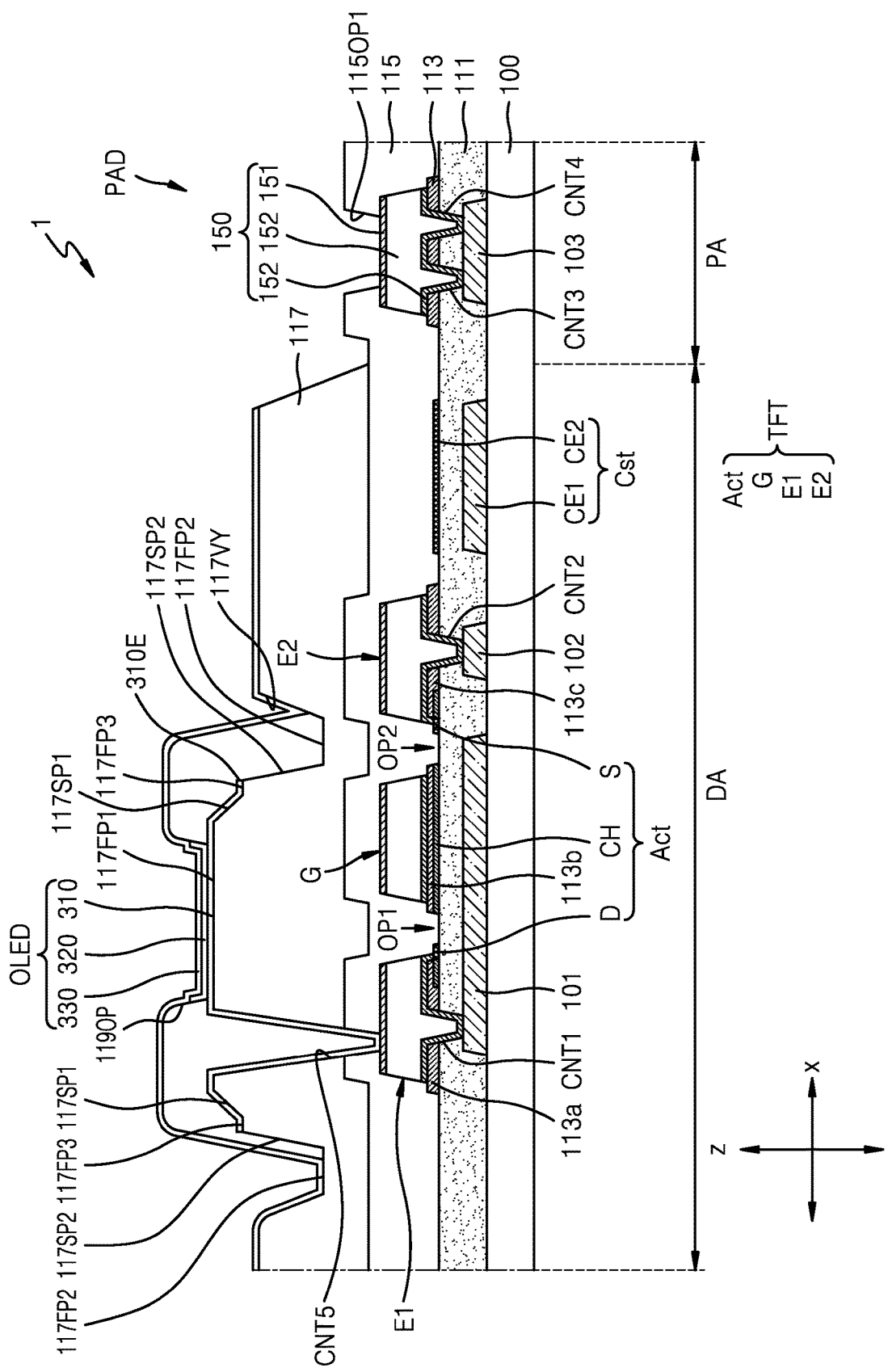
FIG. 7 is a schematic cross-sectional view of a display device according to another embodiment.

FIG. 5 is a schematic cross-sectional view of the display device according to an embodiment, and FIG. 6 is an enlarged cross-sectional view of region X shown in FIG. 5. FIG. 7 is a schematic cross-sectional view of the display device according to another embodiment.

Referring to FIG. 5, the display device 1 may include a thin-film transistor TFT disposed above the substrate 100 corresponding to the display area DA, the storage capacitor Cst, and the pad portion PAD disposed above the substrate 100 corresponding to the peripheral area PA. The thin-film transistor TFT may correspond to at least one of the first thin-film transistor T1, the second thin-film transistor T2, and the third thin-film transistor T3 described with reference to FIG. 4. The thin-film transistor TFT may include a semiconductor layer Act and a gate electrode G. The storage capacitor Cst may include a first capacitor electrode CE1 and a second capacitor electrode CE2. The pad portion PAD may include an auxiliary pad electrode 103 and a pad electrode 150.

The substrate 100 may include a glass material, a ceramic material, a metal material, or a metal that is flexible or bendable. When the substrate 100 is flexible or bendable, the substrate 100 may include a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 may have a single-layer or multi-layer structure including the aforementioned materials, and the multi-layer may further include an inorganic layer. In some embodiments, the substrate 100 may have a structure including an organic material/an inorganic material/an organic material.

The buffer layer 111 may reduce or prevent permeation of impurities, moistures, or external air from underneath the substrate 100, and may provide an even surface on the substrate 100. The buffer layer 111 may include an inorganic material such as an oxide or a nitride, an organic material, or an organic-inorganic hybrid material, and may have a single-layer structure or a multi-layer structure including an inorganic materials and/or an organic material.

The display device 1 may further include a barrier layer (not shown) between the substrate 100 and the buffer layer 111. The barrier layer may prevent or minimize impurities from the substrate 100 and the like permeating into the semiconductor layer Act. The barrier layer may include an inorganic material such as an oxide or a nitride, an organic material, or an organic-inorganic hybrid material, and may have a single-layer structure or a multi-layer structure including inorganic materials and/or organic materials.

A first lower electrode 101, a second lower electrode 102, the first capacitor electrode CE1, and the auxiliary pad electrode 103 may be arranged between the substrate 100 and the buffer layer 111. In some embodiments, the first lower electrode 101 and the second lower electrode 102 may each include any one of signal wirings such as a source electrode, a drain electrode, and a data line.

The first lower electrode 101, the second lower electrode 102, the first capacitor electrode CE1, and the auxiliary pad electrode 103 may include at least one of conductive materials including molybdenum (Mo), aluminum (Al), copper (Cu), titanium (Ti), and the like, and may have a single-layer or multi-layer structure including the aforementioned materials.

The semiconductor layer Act may be disposed on the buffer layer 111. The semiconductor layer Act may overlap the first lower electrode 101. The semiconductor layer Act may include an oxide semiconductor material. Although FIG. 5 illustrates the semiconductor layer Act including the oxide semiconductor, in some embodiments, the semiconductor layer Act may include amorphous silicon or polysilicon. Hereinafter, an embodiment in which the semiconductor layer Act includes an oxide semiconductor is described.

The semiconductor layer Act may include an oxide of at least one material selected from a group consisting of indium (In), gallium (Ga), stanium (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). For example, the semiconductor layer Act may include an InSnZnO (ITZO) semiconductor layer or an InGaZnO (IGZO) semiconductor layer. Because an oxide semiconductor has a wide band gap (about 3.1 eV), high carrier mobility, and low leakage current, a voltage drop is not large even in case that a driving time is long. Accordingly, a luminance change due to a voltage drop is not great even during a low-frequency operation.

The semiconductor layer Act may include a channel area CH, and a source region S and a drain area D arranged at two sides of the channel area CH.

A first opening OP1 and a second opening OP2 may be respectively formed in the drain area D and the source area S of the semiconductor layer Act. The first opening OP1 and the second opening OP2 may be respectively arranged at two sides of the channel area CH, with the channel area CH between. The first opening OP1 may be adjacent to a first upper electrode E1, and the second opening OP2 may be adjacent to a second upper electrode E2.

A gate insulating layer 113 may be disposed on the semiconductor layer Act. The gate insulating layer 113 may include silicon oxide, silicon nitride, silicon oxynitride, aluminum oxide, titanium oxide, tantalum oxide, hafnium oxide, zinc oxide, or the like.

The gate insulating layer 113 may be patterned to overlap a portion of the semiconductor layer Act. For example, the gate insulating layer 113 may be patterned to cover less than all of the source area S and the drain area D. The gate insulating layer 113 covers the channel area CH. A part of the semiconductor layer Act that is not covered by the gate insulating layer 113 may be transformed into a conductor by plasma treatment and the like. The part of the semiconductor Act transformed into the conductor may include the source area S and the drain area D. According to another embodiment, the gate insulating layer 113 may not be patterned to overlap a portion of the semiconductor layer Act, but may be arranged on an entire surface of the substrate 100 to cover the semiconductor layer Act.

The gate insulating layer 113 may include a plurality of portions apart from one another, for example, a first insulating pattern 113a, a second insulating pattern 113b, and a third insulating pattern 113c. The first insulating pattern 113a and the third insulating pattern 113c may respectively cover ends of the semiconductor layer Act. The second insulating pattern 113b may overlap the channel area CH.

In the semiconductor layer Act, portions covered by the first insulating pattern 113a, the second insulating pattern 113b, and the third insulating pattern 113c are not exposed to the plasma treatment and therefore are not transformed into conductors, and accordingly, may have properties different from those of portions exposed to the plasma treatment.

Portions of the semiconductor layer Act disposed under the first upper electrode E1 may include a first portion (not shown) and a second portion (not shown) respectively having different carrier concentrations. The first portion may have a carrier concentration corresponding to a carrier concentration of one of the source area S and the drain area D. The second portion may be covered by the first insulating pattern 113a and have a carrier concentration lower than that of the first portion. A material included in the second portion may be identical to a material included in the channel area CH. Like the channel area CH, the second portion may include a portion that has not been transformed into a conductor. The first portion may include a tail area AT adjacent to the first opening OP1. The tail area AT may be connected with another portion of the semiconductor layer Act that has been transformed into a conductor. A portion of the semiconductor layer Act disposed under the second upper electrode E2 may also have a structure similar to the portion of the semiconductor layer Act disposed under the first upper electrode E1.

The second capacitor electrode CE2 of the storage capacitor Cst may be arranged on a same layer as the semiconductor layer Act, and may include a same material as that of the semiconductor layer Act. For example, the second capacitor electrode CE2 may be disposed on the buffer layer 111 and include an oxide semiconductor material. For example, the second capacitor electrode CE2 may include an oxide of at least one material selected from a group consisting of In, Ga, Sn, Zr, V, Hf, Cd, Ge, Cr, Ti, Al, Cs, Ce, and Zn.

The second capacitor electrode CE2 may not be covered by the gate insulating layer 113, and may be exposed to plasma treatment and transformed into a conductor. For example, the second capacitor electrode CE2 may have a carrier concentration identical to those of the source area S and the drain area D of the semiconductor layer Act.

The second capacitor electrode CE2 of the storage capacitor Cst overlaps the first capacitor electrode CE1 with the buffer layer 111 between, and may form a capacitance. In this case, the buffer layer 111 may function as a dielectric layer of the storage capacitor Cst.

In an embodiment, as shown in FIG. 5, the storage capacitor Cst may be separately provided without overlapping the thin-film transistor TFT. However, the embodiments are not limited thereto. In some embodiments, the storage capacitor Cst may overlap the thin-film transistor TFT.

The gate electrode G may be disposed on the gate insulating layer 113 to overlap the channel area CH. In addition, the first upper electrode E1, the second upper electrode E2, and the pad electrode 150 may be disposed on the gate insulating layer 113.

The first upper electrode E1, the second upper electrode E2, the gate electrode G, and the pad electrode 150 may include at least one of conductive materials including Mo, Al, Cu, Ti, and the like, and may have a multi-layer structure or a single-layer structure including the aforementioned materials. For example, each of the first upper electrode E1, the second upper electrode E2, the gate electrode G, and the pad electrode 150 may have a multi-layer structure including Ti/Al/Ti.

Each of the first upper electrode E1, the second upper electrode E2, the gate electrode G, and the pad electrode 150 may include a plurality of sub-layers. For example, the first upper electrode E1 may include a first layer E11, a second layer E12 on the first layer E11, and a third layer E13 on the second layer E12. Similarly, the second upper electrode E2 may include a first layer E21, a second layer E22 on the first layer E21, and a third layer E23 on the second layer E22.

The gate electrode G may include a first layer G1, a second layer G2 on the first layer G1, and a third layer G3 on the second layer G2. In addition, the pad electrode 150 may include a first layer 151, a second layer 152 on the first layer 151, and a third layer 153 on the second layer 152.

The first electrode E1 may overlap the first lower electrode 101. The first upper electrode E1 may contact the first lower electrode 101 via a first contact hole CNT1 formed through the buffer layer 111 and the gate insulating layer 113. The first upper electrode E1 may be electrically connected with a portion of the semiconductor layer Act, for example, the drain area D. The semiconductor layer Act and the first lower electrode 101 may be electrically connected with each other through the first upper electrode E1. The first upper electrode E1 may function as a bridge configured to electrically connect the semiconductor layer Act with the first lower electrode 101.

The second upper electrode E2 may overlap the second lower electrode 102. The second upper electrode E2 may contact the second lower electrode 102 via a second contact hole CNT2 formed through the buffer layer 111 and the gate insulating layer 113. The second upper electrode E2 may be electrically connected with a portion of the semiconductor layer Act, for example, the source area S. The semiconductor layer Act and the second lower electrode 102 may be electrically connected with each other through the second upper electrode E2. The second upper electrode E2 may function as a bridge to electrically connect the semiconductor layer Act with second lower electrode 102.

The pad electrode 150 may overlap the auxiliary pad electrode 103. The pad electrode 150 may be connected with the auxiliary pad electrode 103 via a third contact hole CNT3 and a fourth contact hole CNT4 formed through the buffer layer 111 and the gate insulating layer 113. Although FIG. 5 illustrates two contact holes connecting the pad electrode 150 with the auxiliary pad electrode 103, the number of contact holes may be smaller or greater. In addition, although FIG. 5 illustrates the auxiliary pad electrode 103, in some embodiments, the auxiliary pad electrode 103 may be omitted.

An inorganic insulating layer 115 may be provided to cover the first upper electrode E1, the second upper electrode E2, the gate electrode G, the second capacitor electrode CE2, and the pad electrode 150.

In an embodiment, the inorganic insulating layer 115 may expose at least a portion of the pad portion PAD. For example, a first opening 115OP1 of the inorganic insulating layer 115 may expose a portion of the pad electrode 150. The inorganic insulating layer 115 may include silicon oxide, silicon nitride, silicon oxynitride, aluminum oxide, titanium oxide, tantalum oxide, hafnium oxide, zinc oxide, or the like. The inorganic insulating layer 115 may include a single-layer or multi-layer including the aforementioned materials.

A planarization layer 117, which is a first insulating layer, may be disposed on the inorganic insulating layer 115. The planarization layer 117 may expose the pad portion PAD. The planarization layer 117 may include an opening corresponding to the peripheral area PA, and may not overlap the pad portion PAD.

As a comparative example, when a planarization layer is exposed at a perimeter of a display panel, the planarization layer may function as a permeation path from outside, and may cause degradation of light-emitting devices and the like. The pad portion PAD, of which a portion is exposed without being covered by the inorganic insulating layer 115 and the planarization layer 117, may be electrically connected with a flexible printed circuit board.

The planarization layer 117 may include a single-layer or multi-layer including an organic material. The planarization layer 117 may include, for example, a general-purpose polymer such as benzocyclobutene (BCB), polyimide, hexamethyldisiloxane (HMDSO), polymethylmethacrylate (PMMA), and polystyrene (PS), a polymer derivative having a phenolic croup, an acrylic polymer, an imide-based polymer, an aryl ether-based polymer, an amide-based polymer, a fluorine-based polymer, a p-xylene-based polymer, or a vinyl alcohol-based polymer, blends thereof, and the like. The planarization layer 117 may include a single-layer or multi-layer including the aforementioned materials.

The inorganic insulating layer 115 and the planarization layer 117 may include a fifth contact hole CNT5 configured to connect the thin-film transistor TFT with the first electrode 310. The organic light-emitting diode OLED may be disposed on the planarization layer 117. The organic light-emitting diode OLED may include the first electrode 310, an emission layer 320, and a second electrode 330 opposite to the first electrode 310.

The first electrode 310 may include a pixel electrode. The first electrode 310 may be connected to the first upper electrode E1 via the fifth contact hole CNT5 through the planarization layer 117 and the inorganic insulating layer 115. The first electrode 310 may include a (semi) light-transmitting electrode or a reflective electrode. In some embodiments, the first electrode 310 may include: a reflective layer including Ag, Mg, Al, Pt, Pd, Au, Ni, Nd, Ir, Cr, compounds thereof and the like; and a transparent or semi-transparent electrode layer formed on the reflective layer. The first electrode 310 may include a transparent or semi-transparent electrode layer including indium tin oxide (ITO), indium zinc oxide (IZO), zinc oxide (ZnO), indium oxide ($In_2O_3$), indium gallium oxide (IGO), or aluminum zinc oxide (AZO). The first electrode 310 may include a single film, a double-layer film, or more films.

Referring to FIGS. 5 and 6, a top surface of the planarization layer 117 may include a first surface portion 117FP1 and a second surface portion 117FP2 adjacent to each other. The first surface portion 117FP1 and the second surface portion 117FP2 may have relatively flat surfaces. For example, in an embodiment, the first surface portion 117FP1 and the second surface portion 117FP2 may be substantially parallel to a top surface of the substrate 100. A vertical distance from the top surface of the substrate 100 to the second surface portion 117FP2 may be smaller than a vertical distance from the top surface of the substrate 100 to the first surface portion 117FP1. In other words, the planarization layer 117 may be thicker in the portion that corresponds to the first surface portion 117FP1 than in the portion that corresponds to the second surface portion 117FP2. The top surface of the planarization layer 117 may have a step between the first surface portion 117FP1 and the second surface portion 117FP2.

The top surface of the planarization layer 117 may include a first slope portion 117SP1 between the first surface portion 117FP1 and the second surface portion 117FP2. The first slope portion 117SP1 may be incline downward with respect to the first surface portion 117F1. The first slope portion 117SP1 may incline downward in a direction away from the first surface portion 117FP1 or a direction toward the second surface portion 117FP2.

The top surface of the planarization layer 117 may include a second slope portion 117SP2 between the first slope portion 117SP1 and the second surface portion 117FP2. The second slope portion 117SP2 may incline downward in a direction away from the first slope portion 117SP1 or a direction toward the second surface portion 117FP2.

The first electrode 310 may overlap only a portion of the planarization layer 117. In some embodiments, the first electrode 310 may overlap the first surface portion 117FP1 and the first slope portion 117SP1 of the planarization layer 117. The first surface portion 117FP1 may overlap a center portion of the first electrode 310. In other words, the first surface portion 117FP1 may overlap an opening 119OP in a bank layer 119. The first slope portion 117SP1 may overlap an edge 310E of the first electrode 310.

In some embodiments, the first electrode 310 may not be arranged on the second slope portion 117SP2 and the second surface portion 117FP2 of the planarization layer 117. That is, the first electrode 310 may not overlap the second slope portion 117SP2 and the second surface portion 117FP2.

In an embodiment, the second slope portion 117SP2 may incline downward from the edge 310E of the first electrode 310. The second slope portion 117SP2 may incline downward in a direction away from the first electrode 310, for example, the edge 310E of the first electrode 310. In a plane, a boundary of the first electrode 310 may correspond to a boundary of the second slope portion 117SP2 of the planarization layer 117.

An angle of the first slope portion 117SP1 with respect to the top surface of the substrate 100 may be different from angle of the second slope portion 117SP2 with respect to the top surface of the substrate 100. In an embodiment, the angle of the first slope portion 117SP1 with respect to the top surface of the substrate 100 may be smaller than the angle of the second slope portion 117SP2 with respect to the top surface of the substrate 100. For example, a degree between the second slope portion 117SP2 and the top surface of the substrate 100 may be from about 70° to about 90°. In some embodiments, the angle between the second slope portion 117SP2 and the top surface of the substrate 100 may be from about 80° to about 90°. As it will be described later, the first slope portion 117SP1 and the second slope portion 117SP2 of the planarization layer 117 may be formed in separate processes.

In an embodiment, the first surface portion 117FP1, the second slope portion 117SP1, the second slope portion 117SP2, and the second surface portion 117FP2 of the planarization layer 117 may be sequentially and continuously arranged in a direction, for example, a direction toward the peripheral area PA. However, referring to FIG. 7, in some embodiments, the top surface of the planarization layer 117 may further include a third surface portion 117FP3 between the first slope portion 110SP1 and the second slope portion 117SP2. In this case, the third surface portion 117FP3 may be a relatively flat portion. The third surface portion 117FP3 may overlap the first electrode 310. For example, the edge 310E of the first electrode 310 may be disposed on the third surface portion 117FP3.

The planarization layer 117 may include a valley portion 117VY arranged around the first electrode 310. In an embodiment, the valley portion 117VY may include a recess portion in which at least a portion of the planarization layer 117 is recessed in a direction toward the substrate 100 (for example, a −Z axis direction). In an embodiment, the valley portion 117VY may be provided as a groove (or a hole) through at least a portion of the planarization layer 117. In an embodiment, in a top-plan view, the valley portion 117VY may be arranged along the edge 310E of the first electrode 310. For example, the valley portion 117VY may have a closed-loop shape surrounding the edge of the first electrode 310.

In an embodiment, the second slope portion 117SP2 of the planarization layer 117 may include a side surface of the valley portion 117VY. In addition, the second surface portion 117FP2 of the planarization layer 117 may include a bottom surface of the valley portion 117VY. The second surface portion 117FP2, which is the bottom surface of the valley portion 117VY, may have a step with a fourth surface portion 117FP4 adjacent to the second surface portion 117FP2. A vertical distance between the second surface portion 117FP2 and the top surface of the substrate 100 may be smaller than a vertical distance between the fourth surface portion 117FP4 and the top surface of the substrate 100. As it will be described later with reference to FIG. 8H, the valley portion 117VY, the second slope portion 117SP2, and the second surface portion 117FP2 of the planarization layer 117 may be simultaneously formed by a same process.

As shown in FIG. 5, the top surface of the planarization layer 117 extending toward the display area DA, as well as the planarization layer 117 extending toward the peripheral area PA, may have a shape (or a structure) identical to the aforementioned shape (or a structure) of the planarization layer 117. The top surface of the planarization layer 117 extending toward the display area DA may include the first surface portion 117FP1, the second surface portion 117FP2 lower than the first surface portion 117FP1 and having a step, the first slope portion 117SP1 arranged between the first surface portion 117FP1 and the second surface portion 117FP2, and the second slope portion 117SP2 arranged between the first slope portion 117SP1 and the second surface portion 117FP2 and inclining downward from the edge 310E of the first electrode 310. In addition, the planarization layer 117 may include the valley portion VY, an inner surface of which includes the second slope portion 117SP2 and the second surface portion 117FP2.

The bank layer 119 may be disposed on the planarization layer 117. The bank layer 119 may cover the edge 310E of the first electrode 310 and may have the opening 1190P exposing a portion of the first electrode 310. The bank layer 119 may cover the edge of the first electrode 310 to increase a distance between the edge of the first electrode 310 and the second electrode 330 above the first electrode 310, to thereby prevent arc and the like generated at the edge 310E of the first electrode 310.

The bank layer 119 may include at least one organic insulating material selected from a group consisting of polyimide, polyamide, an acryl resin, BCB, and a phenol resin.

In an embodiment, the bank layer 119 may overlap the first surface portion 117FP1, the first slope portion 117SP1, the second slope portion 117SP2, and the second surface portion 117FP2 of the planarization layer 117. At least a portion of the bank layer 119 may be buried into the valley portion 117VY arranged around the edge 310E of the first electrode 310. The second surface portion 117FP2, which is the bottom portion of the valley portion 117VY, may have a step with the first surface portion 117FP1, as described above. Accordingly, compared with an embodiment in which the planarization layer does not include the second surface portion or the valley portion having a step with the first surface portion, the bank layer covering the edge of the first electrode may have a smaller thickness.

However, according to an embodiment, the top surface of the planarization layer 117 includes the first slope portion 117SP1 between the first surface portion 117FP1 and the second surface portion 117F2, and the first slope portion 117SP1, on which the edge of the first electrode 310 is arranged, may incline downward with respect to the first surface portion 117FP1. Accordingly, a vertical distance from the top surface of the first electrode 310 corresponding to the first slope portion 117SP1 to the top surface of the bank layer 119 may increase toward the edge 310E of the first electrode 310. For example, a vertical distance h1 from the top surface of the first electrode 310 to the top surface of the bank electrode 119, at the edge 310E of the first electrode 310, may be greater than a vertical distance h2 from the top surface of the first electrode 310 corresponding to a boundary between the first surface portion 117FP1 and the first slope portion 117SP1 to the top surface of the bank layer 119.

As a comparative example, when the top surface of the planarization layer does not include the first slope portion and the edge of the first electrode is disposed on a surface extending flat from the first surface portion, a vertical distance from the top surface of the first electrode to the top surface of the bank layer may decrease toward the edge of the first electrode. In this case, the bank layer may not properly cover the edge of the first electrode, and thus, the first electrode may be short-circuited by the second electrode disposed on the bank layer. Thus, defects such as dark spots on the light-emitting devices may occur.

However, according to an embodiment, as the top surface of the planarization layer 117 includes the first slope portion 117SP1 between the first surface portion 117FP1 and the second surface portion 117FP2, the edge 310E of the first electrode 310 disposed on the first slope portion 117SP1 may incline downward. Accordingly, a distance between the edge of the first electrode 310 and the top surface of the bank layer 119 may relatively increase, and the bank layer 119 may sufficiently cover the edge 310E of the first electrode 310 to prevent occurrence of the light-emission defects as described above.

The emission layer 320 may be disposed on the first electrode 310. The emission layer 320 may overlap the opening 1190P of the bank layer 119. The emission layer 320 may include a low-molecular material or high-molecular material, and may emit red, green, or blue light. In some embodiments, the emission layer 320 may be patterned to correspond to each of the first electrodes 310. In some embodiments, the emission layer 320 may be integrally formed across the first electrodes 310.

In some embodiments, a hole injection layer (HIL) and/or a hole transport layer (HTL) may be disposed between the first electrode 310 and the emission layer 320.

The second electrode 330 may be disposed on the emission layer 320. The second electrode 330 may include a conductive material having a small work function. For example, the second electrode 330 may include a (semi) transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or alloys thereof. Alternatively, the second electrode 330 may further include a layer including ITO, IZO, ZnO, or $In_2O_3$ on the (semi) transparent layer including the aforementioned materials. In an embodiment, the second electrode 330 may cover an entire portion of the display area DA.

In some embodiments, an electron transport layer (ETL) and/or an electron injection layer (EIL) may be disposed between the emission layer 320 and the second electrode 330.

As the organic light-emitting diode OLED may be easily damaged by moisture or oxygen from outside, the encapsulation layer 400 may be arranged to cover and protect the organic light-emitting diode OLED, as it will be described later with reference to FIG. 11. The encapsulation layer 400 may include at least one organic encapsulation layer and at least one inorganic encapsulation layer.

Although the display device has been mainly described, the embodiments are not limited thereto. For example, a method of manufacturing the display device may also be considered as being included in the scope of the disclosure.

FIGS. 8A to 8J are cross-sectional views of a method of manufacturing a display device, according to an embodiment. More particularly, FIGS. 8A to 8J are cross-sectional views of the method of manufacturing a device according to an embodiment, based on FIGS. 5 and 6.

Figure 8A:
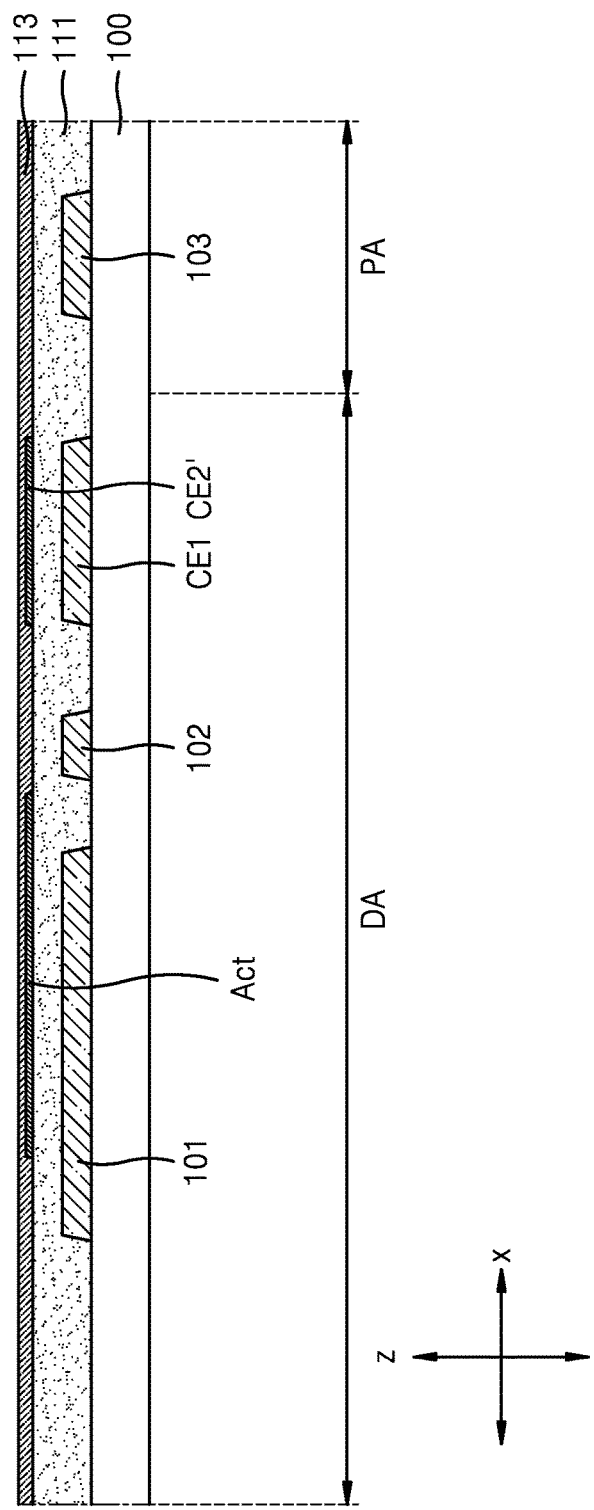
FIGS. 8A to 8J are cross-sectional views showing a method of manufacturing a display device, according to an embodiment.

Referring to FIG. 8A, first, the first lower electrode 101, the second lower electrode 102, the first capacitor electrode CE1 of the storage capacitor Cst, and the auxiliary pad electrode 103 may be formed on the substrate 100. The first lower electrode 101, the second lower electrode 102, the first capacitor electrode CE1, and the auxiliary pad electrode 103 may be formed by patterning a preliminary conductive layer (not shown). A photolithography process may be used to pattern the preliminary conductive layer.

More particularly, a photoresist layer (not shown) may be exposed and developed on the preliminary conductive layer (not shown) using a first mask to form a photoresist pattern (not shown). The photoresist may include a positive type or a negative type. The preliminary conductive layer may be etched by using the photoresist pattern as an etch mask and the photoresist pattern may be removed to form the first lower electrode 101, the second lower electrode 102, the first capacitor electrode CE1 of the storage capacitor Cst, and the auxiliary pad electrode 103.

The buffer layer 111 may be cover the first lower electrode 101, the second lower electrode 102, the first capacitor electrode CE1 of the storage capacitor Cst, and the auxiliary pad electrode 103. The buffer layer 111 may be formed using deposition methods, for example, chemical vapor deposition (CVD), thermal chemical vapor deposition (TCVD), plasma enhanced chemical vapor deposition (PECVD), sputtering, e-beam evaporation, and the like.

The semiconductor layer Act and a preliminary second capacitor electrode CE2' of the storage capacitor Cst may be formed on the buffer layer 111. The semiconductor layer Act and the preliminary second capacitor electrode CE2' may be formed by patterning a preliminary semiconductor layer (not shown). For forming the semiconductor layer Act and the preliminary second capacitor electrode CE2', a second mask including a pattern corresponding to the semiconductor layer Act and the preliminary second capacitor electrode CE2' may be used, and for example, a photolithography process may be used. The preliminary semiconductor layer may include an oxide semiconductor, and may be deposited, for example, in CVD method.

The gate insulating layer 113 may be formed on the semiconductor layer Act. The gate insulating layer 113 may be formed using, for example, CVD, TCVD, PECVD, sputtering, e-beam evaporation, and the like.

Figure 8B:
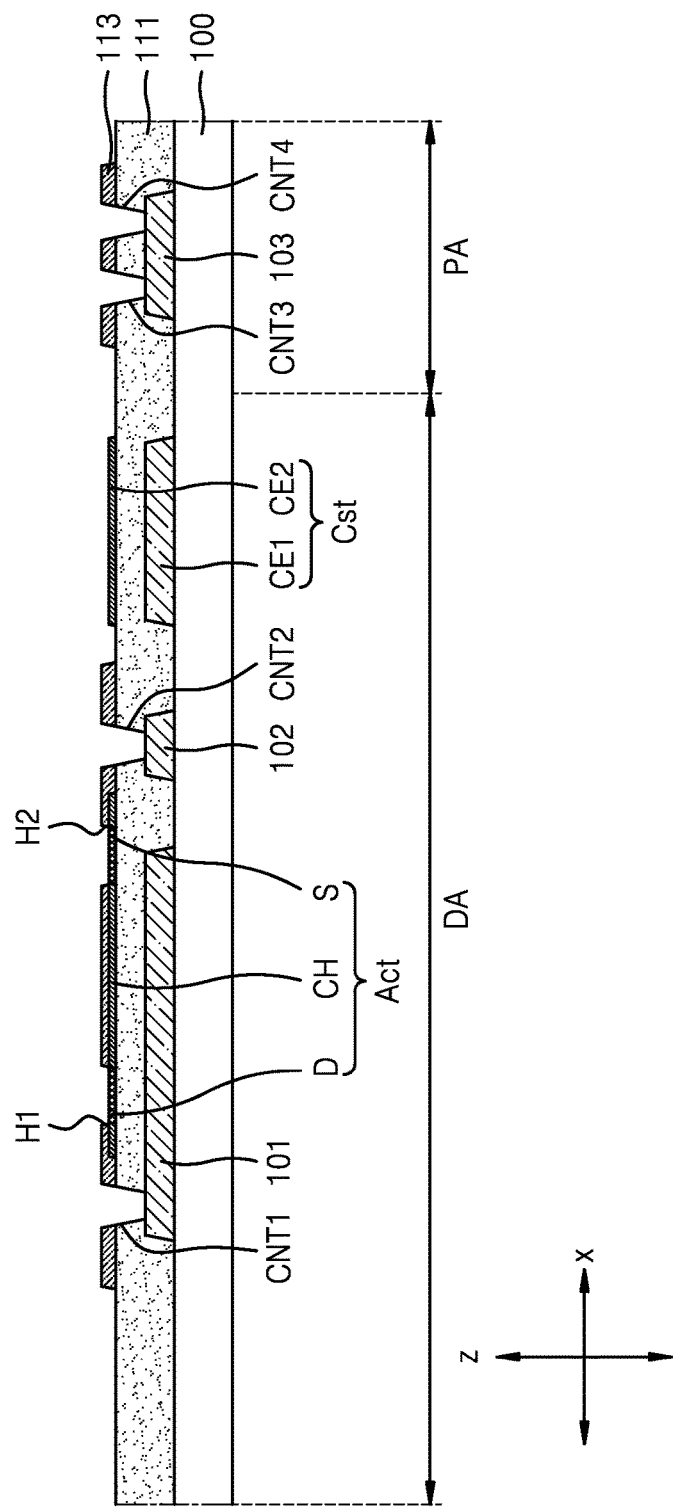

Referring to FIG. 8B, the gate insulating layer 113 and/or the buffer layer 111 may be partially removed to form a first hole H1, a second hole H2, the first contact hole CNT1, the second contact hole CNT2, the third contact hole CNT3, and the fourth contact hole CNT4. For forming the first hole H1, the second hole H2, and the first contact hole CNT1 to the fourth contact hole CNT4, a third mask including patterns corresponding to the first hole H1, the second hole H2, and the first contact hole CNT1 to the fourth contact hole CNT4 may be used, and for example, a photolithography process may be used.

The first contact hole CNT1 to the fourth contact hole CNT4 may be formed through the buffer layer 111 and the gate insulating layer 113. A portion of the first lower electrode 101 may be exposed by the first contact hole CNT1, and a portion of the second lower electrode 102 may be exposed by the second contact hole CNT2. In addition, a portion of the auxiliary pad electrode 103 may be exposed by the third contact hole CNT3 and the fourth contact hole CNT4.

The first hole H1 and the second hole H2 may be formed through the gate insulating layer 113 and expose an area of the semiconductor layer Act. The area of the Semiconductor layer Act exposed by the first hole H1 and the second hole H2 may be transformed into a conductor by plasma treatment and the like. The area that has been transformed into the conductor may correspond to portions of the source area S and the drain area D of the semiconductor layer Act.

Plasma treatment is chemically or physically modifying a surface of a material as high-energy particles in a plasma state conflict with a surface of the material. As an embodiment, in the plasma treatment, at least one type of gas selected from a group including hydrogen gas, argon gas, helium gas, xenon gas, nitrogen gas, oxynitrogen gas, oxygen, and combination gas thereof.

When the oxide semiconductor undergoes plasma treatment, the oxide semiconductor is reduced, which results in oxygen defects in the oxide semiconductor, and thus, oxygen vacancy increases. The oxide semiconductor with increased oxygen vacancy has increased carrier concentration, and as a result, from among the properties of semiconductors, a concentration of a threshold voltage, which is a threshold voltage at which electricity flows, moves in a negative direction. This indicates that the oxide semiconductor is transformed into a conductor and smoothly conducts electricity.

Figure 8C:
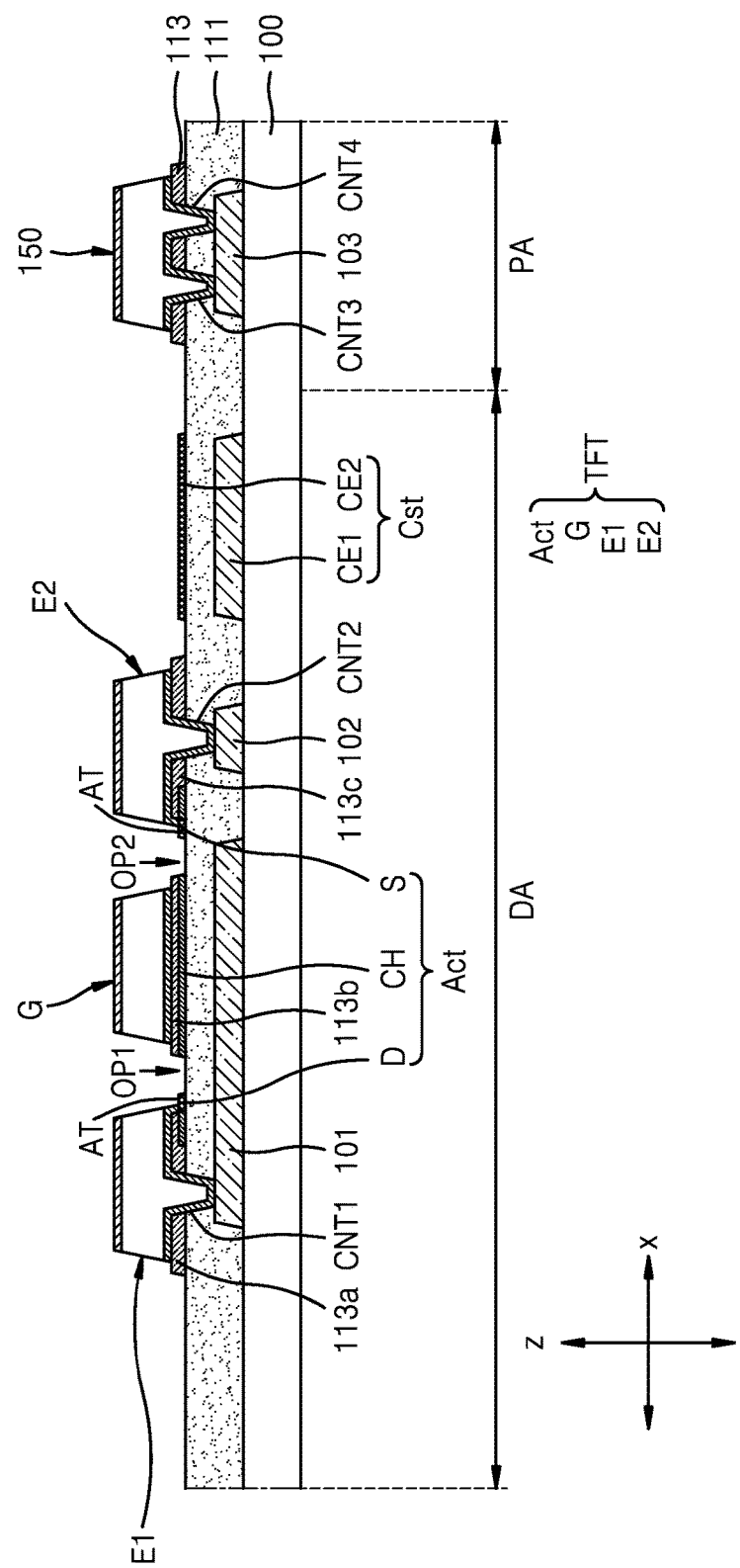

Referring to FIG. 8C, the gate electrode G, the first upper electrode E1, the second upper electrode E2, and the pad electrode 150 may be formed above the gate insulating layer 113. The gate electrode G, the first upper electrode E1, the second upper electrode E2, and the pad electrode 150 may be formed by patterning a preliminary electrode layer (not shown) using a gate photoresist pattern (not shown). The gate photoresist pattern may be formed through a fourth mask.

The preliminary electrode layer may be formed in deposition methods, for example, CVD, PECVD, low pressure CVD, PCVD, sputtering, atomic layer deposition, and the like. The preliminary electrode layer may include a single conductive layer or a plurality of conductive layers. In an embodiment, the preliminary electrode layer may include a first sub-preliminary electrode layer, a second sub-preliminary electrode layer on the first sub-preliminary electrode layer, and the third sub-preliminary electrode layer on the second sub-preliminary electrode layer. The first layers E11, E21, G11, and 151, the second layers E12, E22, G12, and 152, and the third layers E13, E23, G13, and 153 of the first upper electrode E1, the second upper electrode E2, the gate electrode G, and the pad electrode 150 may correspond to patterned portions of the first to third sub-preliminary electrode layers in the preliminary electrode layer.

The preliminary electrode layer may be etched using the gate photoresist pattern as an etch mask. The first upper electrode E1, the second upper electrode E2, the gate electrode G, and the pad electrode 150 may be formed by etching portions that are not protected by the gate photoresist pattern. For example, the etch process may include a wet etch process.

In the etch process to form the first upper electrode E1, the second upper electrode E2, the gate electrode G, and the pad electrode 150, the area of the semiconductor layer Act exposed by the first hole H1 and the second hole H2 may be partially removed. As the portion of the semiconductor layer Act is removed, the first opening OP1 and the second opening OP2 exposing the buffer layer 111 may be formed. In the area of the semiconductor layer Act exposed by the first hole H1 and the second hole H2, a remaining area may overlap the first upper electrode E1 and the second upper electrode E2. The tail area AT adjacent to the first opening OP1 and the second opening OP2 may be connected with another area of the semiconductor layer Act being transferred into a conductor in a following process.

After forming the gate electrode G, the first upper electrode E1, the second upper electrode E2, and the pad electrode 150, the gate insulating layer 113 may be patterned using the gate photoresist pattern as an etch mask without using another mask. An etch process of patterning the gate insulating layer 113 may include, for example, dry etch. The gate insulating layer 113 that has been patterned may include a first insulating pattern 113a, a second insulating pattern 113b, and a third insulating pattern 113c. The first insulating pattern 113a, the second insulating pattern 113b, and the third insulating pattern 113c may be spatially and physically separated from one another.

The areas of the semiconductor layer Act not covered by the gate insulating layer 113 that has been patterned, i.e., the first insulating pattern 113a, the second insulating pattern 113b, and the third insulating pattern 113c, may be transformed into a conductor by plasma treatment. In an embodiment, the preliminary second capacitor electrode CE2' includes an oxide semiconductor material like the semiconductor layer Act, and the preliminary second capacitor electrode CE2' not covered with the gate insulating layer 113 that has been patterned may be transformed into a conductor. That is, the second capacitor electrode CE2 may be formed.

Next, the gate photoresist pattern may be removed (for example, stripped).

Figure 8D:
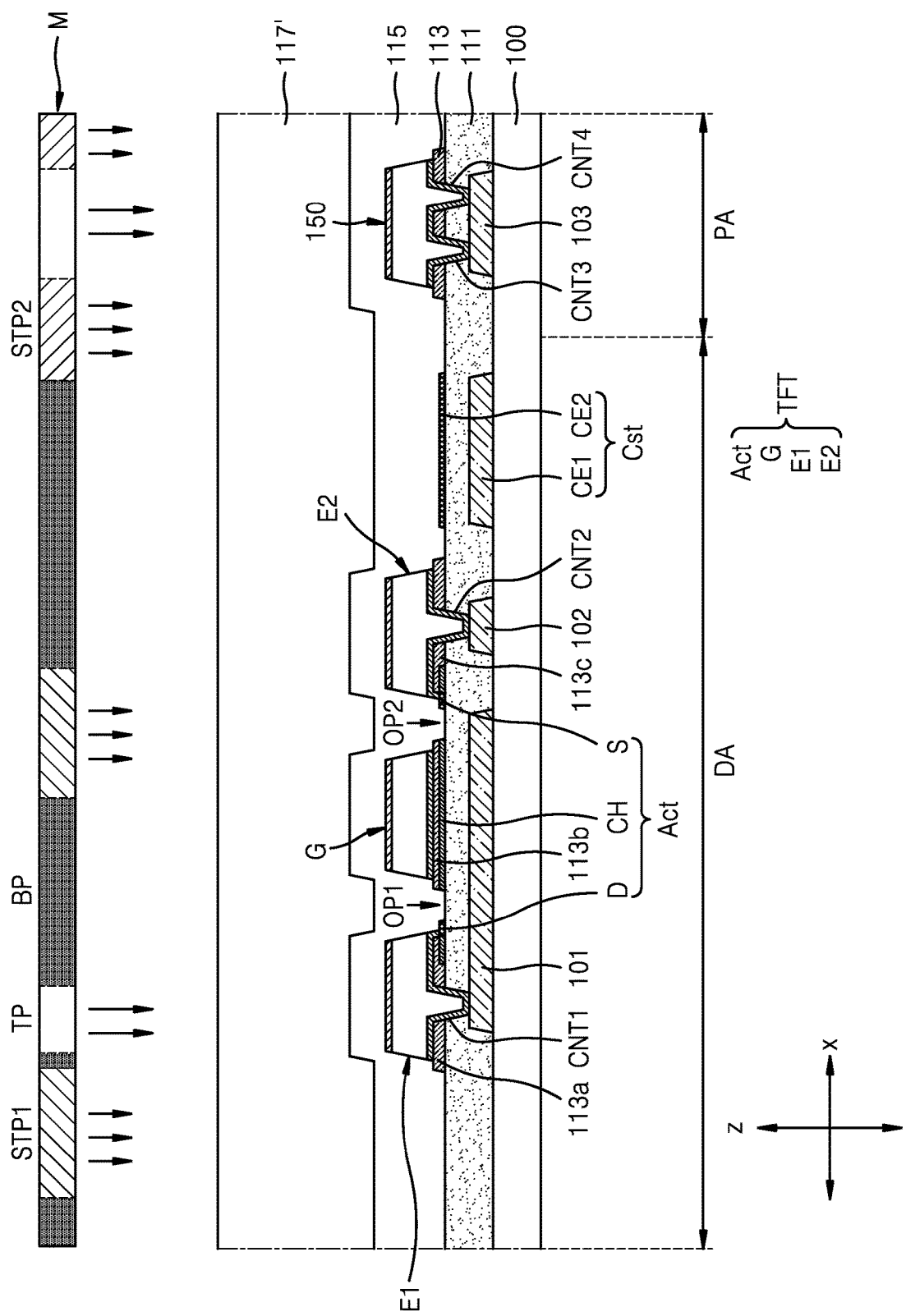

Referring to FIG. 8D, the inorganic insulating layer 115 may be formed to cover the gate electrode G, the first upper electrode E1, the second upper electrode E2, the second capacitor electrode CE2, and the pad electrode 150. The inorganic insulating layer 115 may be formed in deposition methods, for example, CVD, TCVD, PECVD, sputtering, e-beam evaporation, and the like.

A preliminary planarization layer 117' may be formed on the inorganic insulating layer 115. A fifth mask M may be formed to form the planarization layer 117 using the preliminary planarization layer 117', and for example, a photolithography process may be used. For example, the planarization layer 117, that is, the first insulating layer, may be formed by coating the preliminary planarization layer 117', and exposing and developing the preliminary planarization layer 117' by using the fifth mask M. The preliminary planarization layer 117' may be formed in an entire area of the display area DA and the peripheral area PA.

Figure 8E:
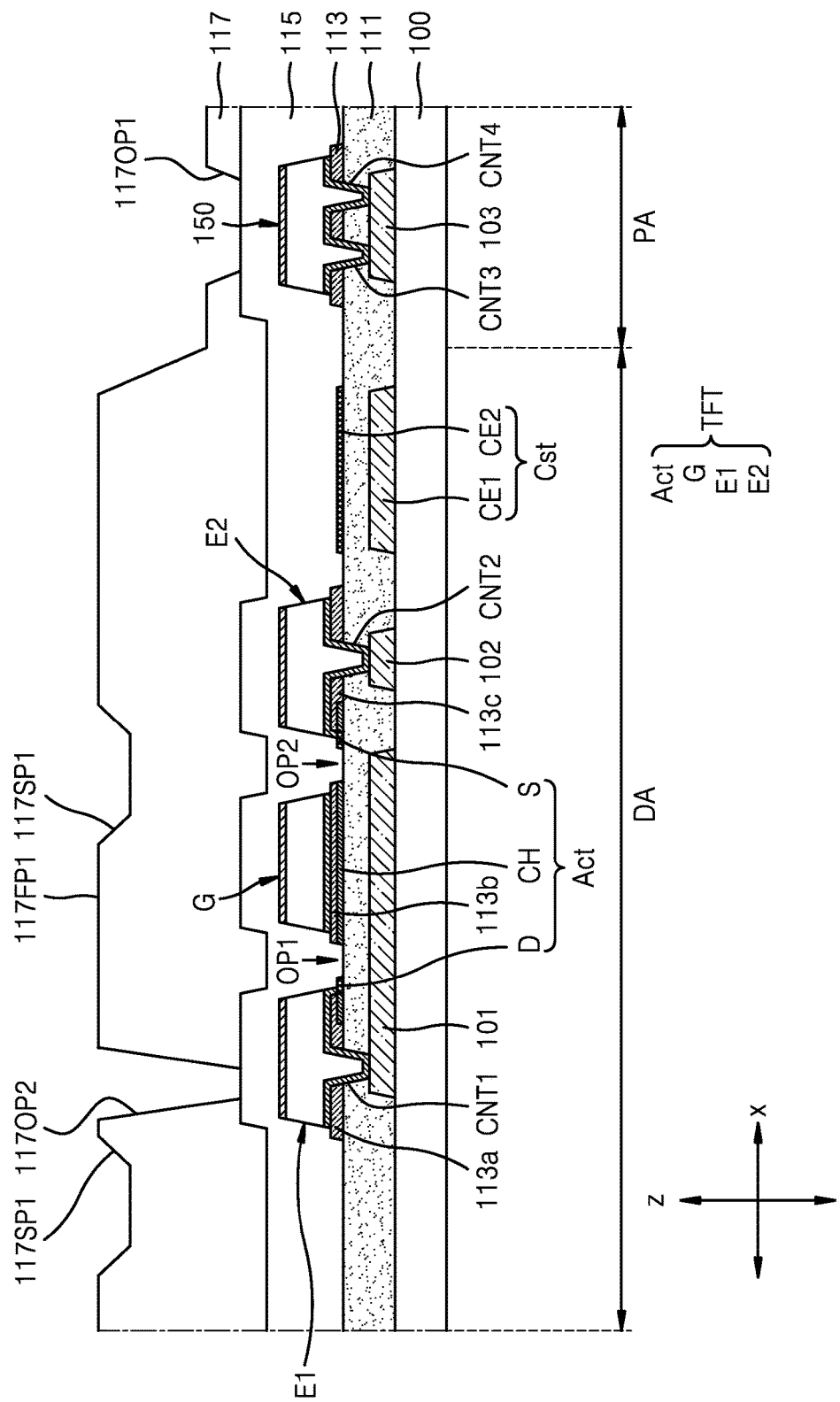

In an embodiment, the preliminary planarization layer 117' may include, for example, a positive-type photoresist. Although FIGS. 8D and 8E illustrate the preliminary planarization layer 117' including the positive-type photoresist, the preliminary planarization layer 117' may also include a negative-type photoresist. In this case, opposite to the case in which the preliminary planarization layer 117' includes the positive type photoresist, an exposed area of the preliminary planarization layer 117' remains after the development process, and as an amount of exposure increases, the remaining portion of the planarization layer 117 may have a greater thickness.

In an embodiment, the fifth mask M may include a half tone mask or a slit mask. The fifth mask M may include a light-blocking portion BP, a first semi light-transmitting portion STP1, a second semi light-transmitting portion STP2, and a light-transmitting portion TP. The light-blocking portion BP may not transmit most of light. The first semi light-transmitting portion STP1 and the second semi light-transmitting portion STP2 may transmit some of the light. The first semi light-transmitting portion STP1 and the second semi light-transmitting portion STP2 may have a light transmittance lower than a light transmittance of the light-blocking portion BP. A light transmittance of the light-transmitting portion TP may be greater than the light transmittance of the first semi light-transmitting portion STP1 and the second light-transmitting portion STP2. In some embodiments, a light transmittance of the first semi light-transmitting portion STP1 may be different from a light transmittance of the semi light-transmitting portion STP2. However, the disclosure is not limited thereto, and in some embodiments, the light transmittance of the first semi light-transmitting portion STP1 may be identical to the light transmittance of the second semi light-transmitting portion STP2.

The light-blocking portion BP, the first semi light-transmitting portion STP1, the second semi light-transmitting portion STP2, and the light-transmitting portion TP may be provided in plural numbers, respectively. In some embodiments, the first semi light-transmitting portion STP1 may overlap with the display area DA and arranged between the light-blocking portions BP.

The preliminary planarization layer 117' may be exposed through the fifth mask M in different amounts of exposure according to portions, and a portion of the preliminary planarization layer 117' may be removed by the development process. As an amount of the portion removed from the preliminary planarization layer 117' varies according to amounts of exposure, the planarization layer 117 that has been patterned and having different thicknesses according to portions may be formed at once.

Referring to FIGS. 8D and 8E, to correspond to portions exposed by the light-transmitting portions TP of the fifth mask M, the planarization layer 117 may include: a first opening 117OP1 overlapping the pad electrode 150; and a second opening 117OP2 overlapping any one of the first upper electrode E1 or the second upper electrode E2. The first opening 117OP1 and the second opening 117OP2 may expose a portion of the inorganic insulating layer 115.

In an embodiment, a portion of the planarization layer 117 exposed by the first semi light-transmitting portion STP1 of the fifth mask M may include a portion of the planarization layer 117 overlapping the edge 310E of the first electrode 310 (see FIG. 8G) in a following process or corresponding to a periphery of the first electrode 310.

The top surface of the planarization layer 117 corresponding to the portion exposed by the first semi light-transmitting portion STP1 of the fifth mask M may include: the first surface portion 117FP1 that is relatively even; and the first slope portion 117SP1 inclining downward with respect to the first surface portion 117FP1. As it will be described later, in a following process, the edge of the first electrode 310 (see FIG. 8G) may be arranged on the first slope portion 117SP1 of the planarization layer 117.

Figure 8F:
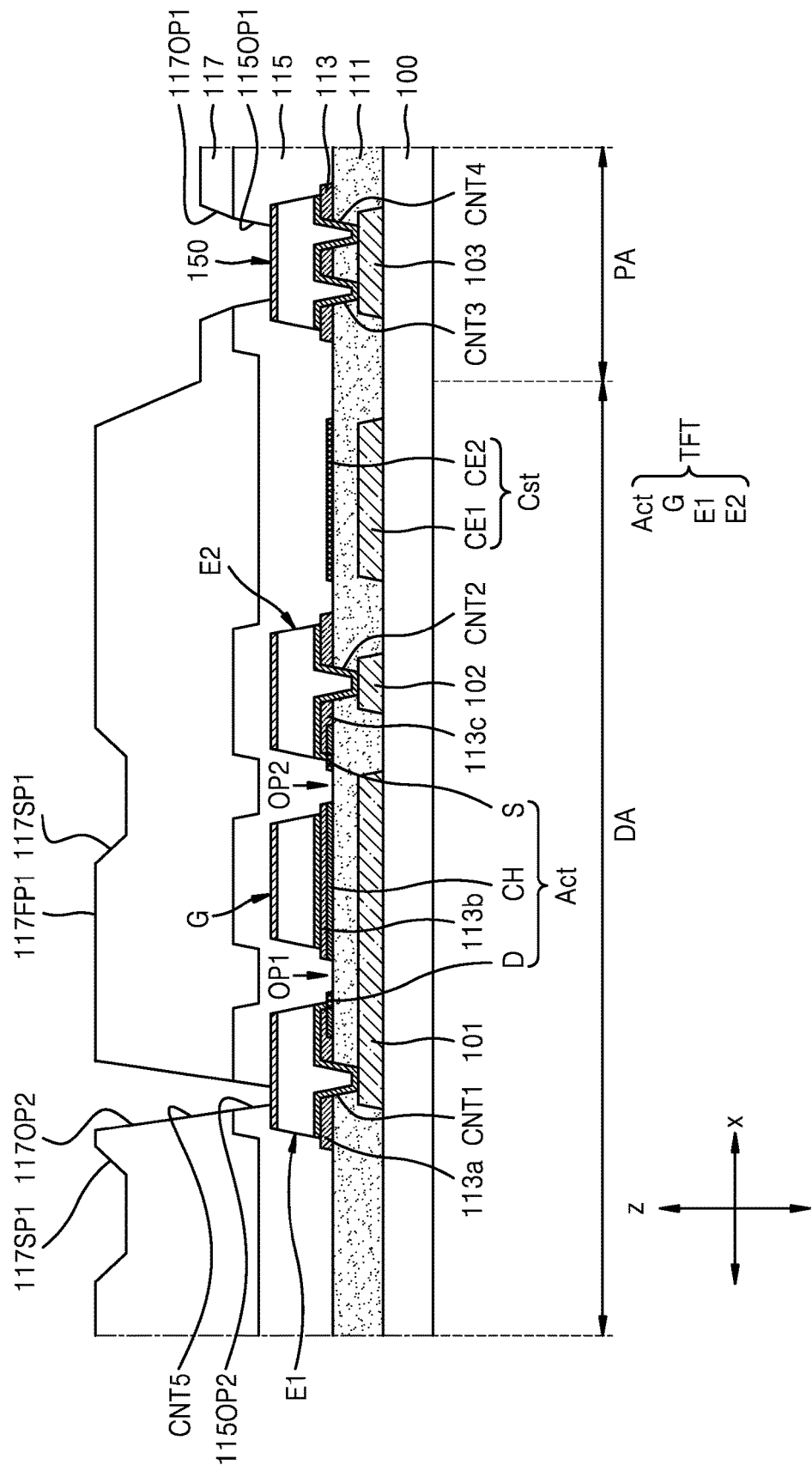

Referring to FIGS. 8E and 8F, the inorganic insulating layer 115 may be etched using the planarization layer 117 that has been patterned. Here, the etch process may be, for example, dry etch. In the etch process, a portion of the inorganic insulating layer 115 may be removed, and therefore, the first opening 115OP1 and the second opening 115OP2 may be formed. The first opening 115OP1 of the inorganic insulating layer 115 may underlap with the first opening 117OP1 of the planarization layer 117. The first opening 115OP1 of the inorganic insulating layer 115 may expose the pad electrode 150. The second opening 115OP2 of the inorganic insulating layer 115 overlap with the second opening 117OP2 of the planarization layer 117. The first opening 115OP1 of the inorganic insulating layer 115 may expose the first upper electrode E1 or the second upper electrode E2. The second opening 115OP2 of the inorganic insulating layer 115 and the second opening 117OP2 of the planarization layer 117 may form a fifth contact hole CNT5. Although not shown in FIG. 8, in some embodiments, when a portion of the inorganic insulating layer 115 is removed, a portion of the planarization layer 117 may also be removed, and thus, a thickness of the planarization layer 117 may generally decrease.

Figure 8G:
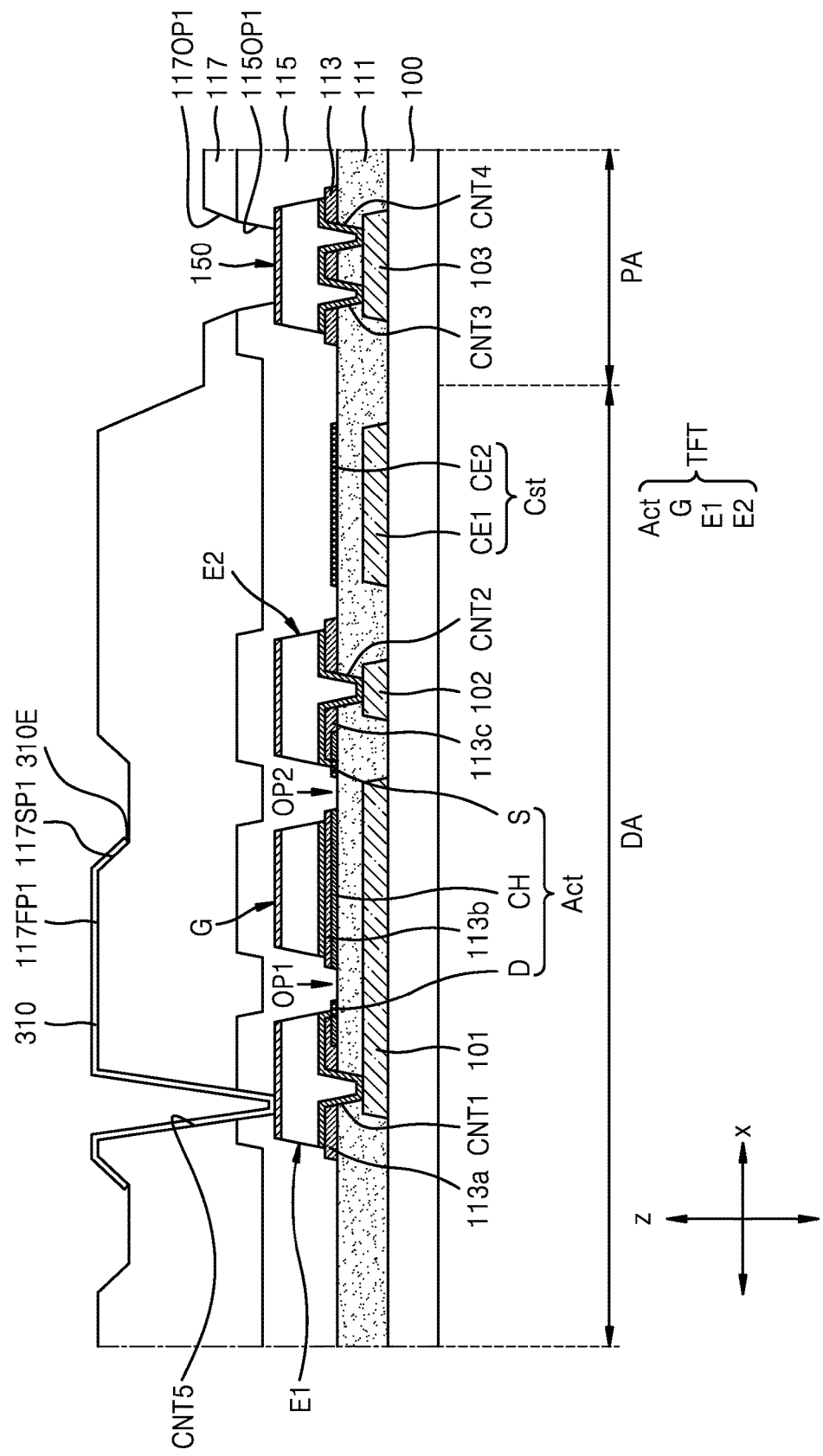

Referring to FIG. 8G, the first electrode 310 may be formed on the planarization layer 117. For forming the first electrode 310, a sixth mask including a pattern corresponding to the first electrode 310 may be used, and for example, a photolithography process may be used.

An anode photoresist pattern (not shown) may be formed on a first preliminary electrode layer (not shown). The first anode photoresist pattern may be formed as the sixth mask. The first electrode 310 may be formed by etching the preliminary first electrode layer using the anode photoresist pattern as an etch mask. The etch may include, for example, wet etch.

In an embodiment, the first electrode 310 may be formed on the first surface portion 117FP1 and the first slope portion 117SP1 of the planarization layer 117. For example, the edge of the first electrode 310 may overlap with the first slope portion 117P1.

The first electrode 310 may contact the first upper electrode E1 of the thin-film transistor TFT via the fifth contact hole CNT5 through the planarization layer 117 and the inorganic insulating layer 115.

Figure 8H:
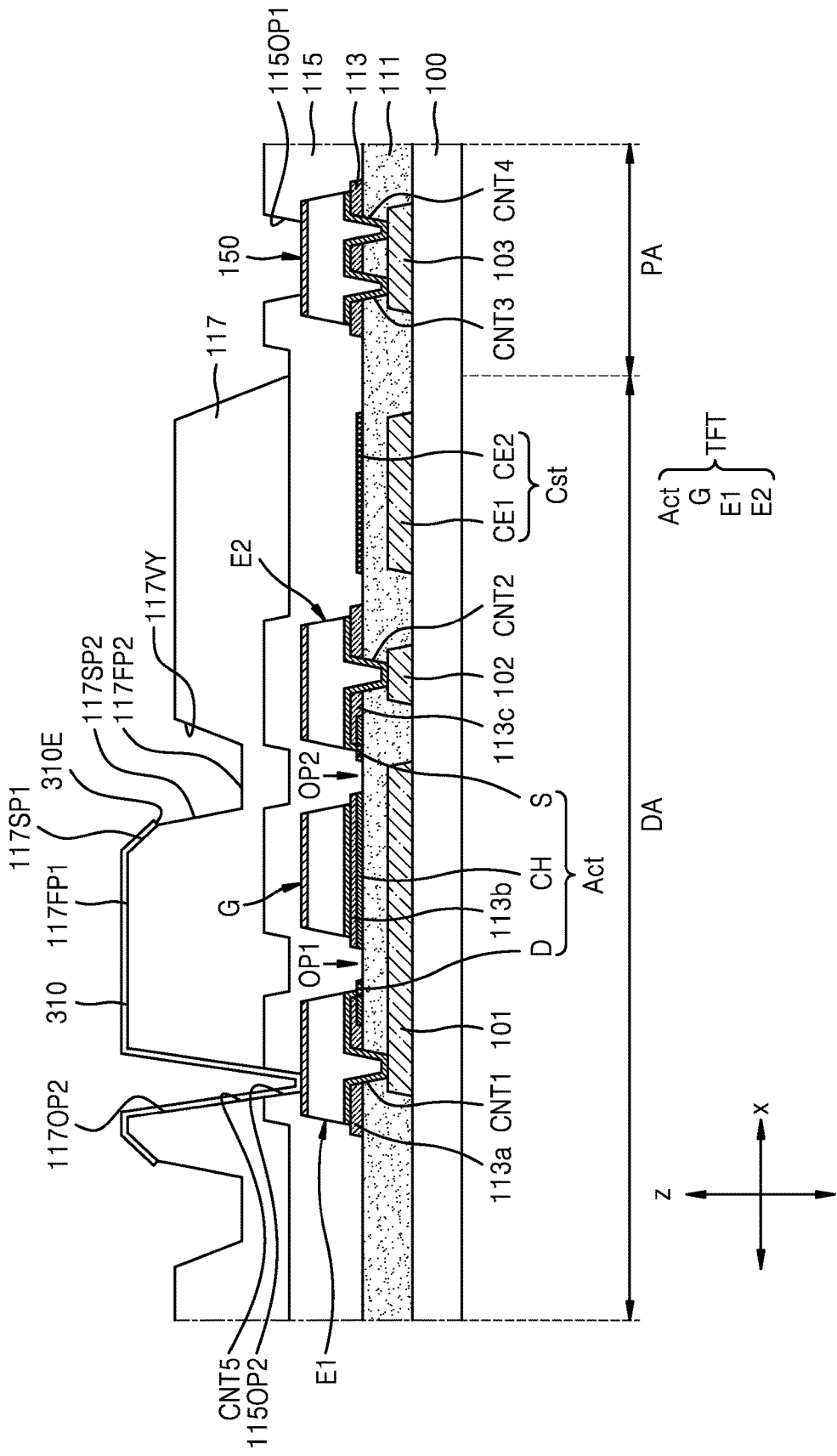

Referring to FIG. 8H, the planarization layer 117 may be partially removed when the anode photoresist pattern has not been removed. For example, the planarization layer 117 may be partially removed by using an ashing process in which oxygen gas is used.

By ashing, a portion of the planarization layer 117 arranged in the peripheral area PA may be removed. The planarization layer 117 may include an opening in the peripheral area PA, for example, the pad portion PAD. The planarization layer 117 remaining in the peripheral area PA may function as a permeation path to prevent degradation of the light-emitting devices.

By ashing, a portion of the planarization arranged in the display area DA may be removed. The anode photoresist pattern, that is, the portion of the planarization layer 117 that does not overlap with the first electrode 310, may be removed. The top surface of the planarization layer 117 that has undergone ashing process may include: the second surface portion 117FP2 having a step with the first surface portion 117FP1 with the first slope portion SP1 between the first surface portion 117FP1 and the second surface portion 117FP2; and the second slope portion 117SP2 between the first slope portion 117SP1 and the second slope portion 117FP2. The second surface portion 117FP2 may have a vertical distance smaller than a vertical distance from the substrate 100 to the first surface portion 117FP1. The second slope portion 117SP2 may incline downward from the edge 310E of the first electrode 310.

In an embodiment, in the ashing process, the valley portion 117VY of the planarization layer 117 arranged along the edge of the first electrode 310 around the first electrode 310 may be formed. For example, the second slope portion 117SP2 and the second surface portion 117FP2 may respectively correspond to an inner side surface and a bottom surface of the valley portion 117VY.

In an embodiment, the second slope portion 117SP2 and the first slope portion 117SP1 may be formed in different processes, respectively. The second surface portion 117FP2 and the first slope portion SP1 of the planarization layer 117 may be formed in separate processes. For example, while forming of the first slope portion 117SP1 of the planarization layer 117 may be performed before forming of the first electrode 310, forming of the second slope portion 117SP2 and the second surface portion 117FP2 may be performed after the forming of the first electrode 310.

Subsequently, the anode photoresist pattern may be removed (for example, stripped).

Figure 8I:
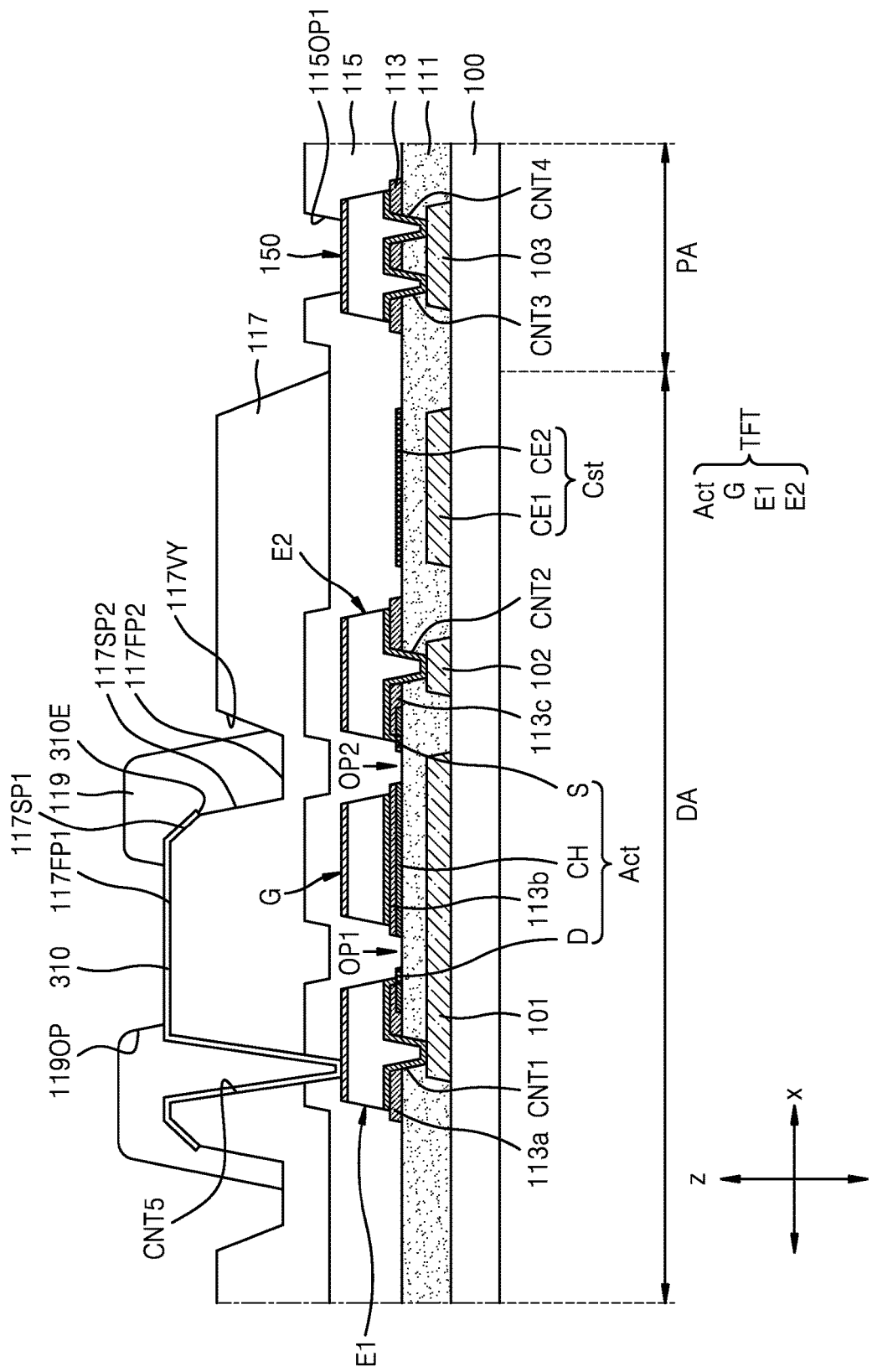

Referring to FIG. 8I, the bank layer 119 covering the edge of the first electrode 310 may be formed on the first electrode 310. The opening 119OP exposing the center portion of the first electrode 310 may be formed in the bank layer 119. For forming the bank layer 119, a seventh mask including a pattern corresponding to the bank layer 119 may be used, and for example, a photolithography process may be used.

Figure 8J:
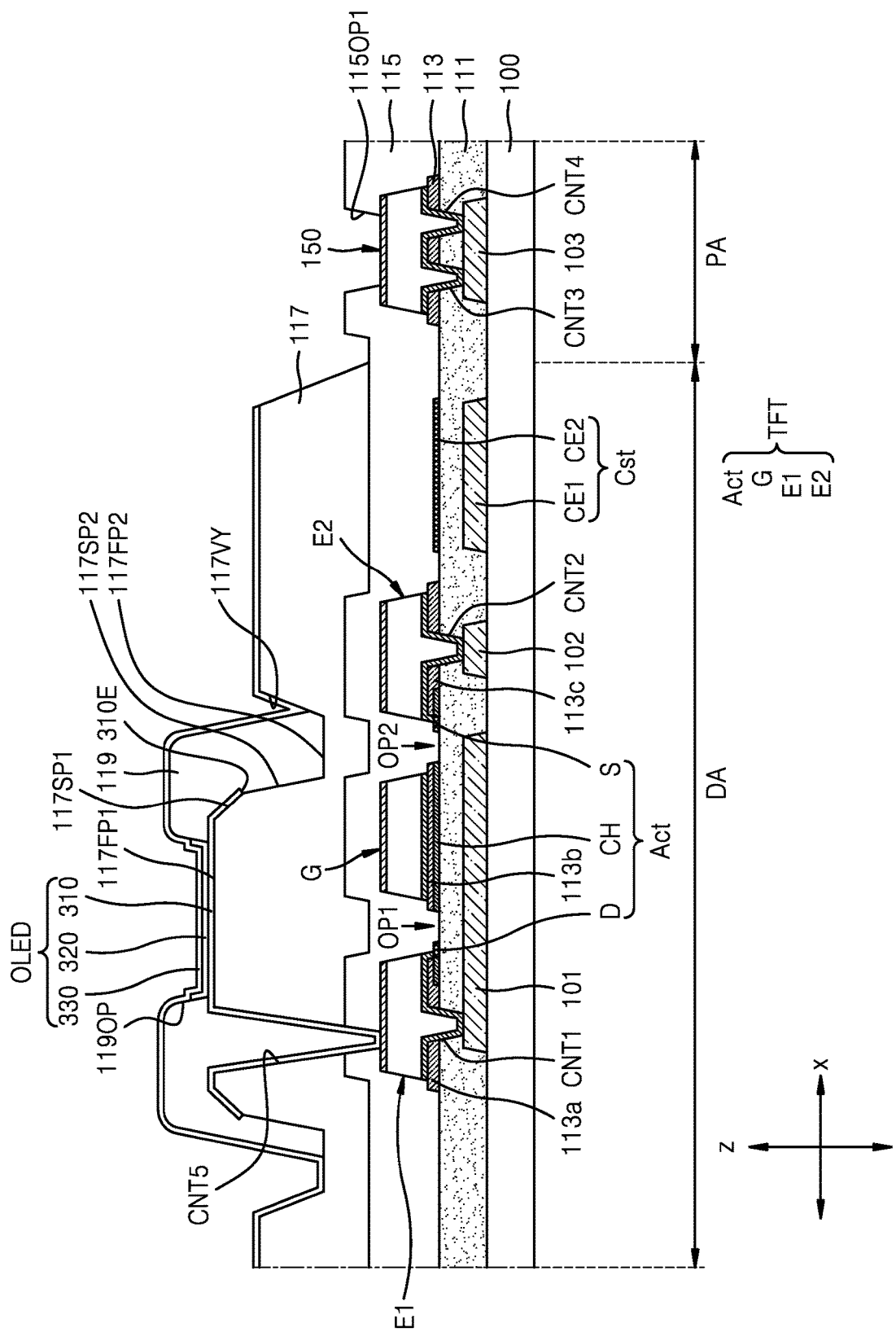

Referring to FIG. 8J, the emission layer 320 may be formed on the first electrode 310, in the opening 119OP of the bank layer 119. The emission layer 320 may be formed by vacuum deposition, screen printing, inkjet printing, laser thermal transfer printing, and the like.

The second electrode 330 may cover the display area DA of the substrate 100. The second electrode 330 may be formed using deposition methods, for example, CVD, TCVD, PECVD, sputtering, e-beam evaporation, and the like.

According to an embodiment, the planarization layer 117 may be patterned by using a half tone mask such that the edge 310E of the first electrode 310 disposed on the planarization layer 117 inclines downward, and by doing so, the bank layer 119 may sufficiently cover the edge 310E of the first electrode 310. Accordingly, defects of the light-emitting device included in the display device 1 may be reduced. In addition, as the display device 1 according to an embodiment is manufactured using seven masks, a cost for manufacturing may be reduced, and the productivity of the display device 1 may be improved.

Figure 9:
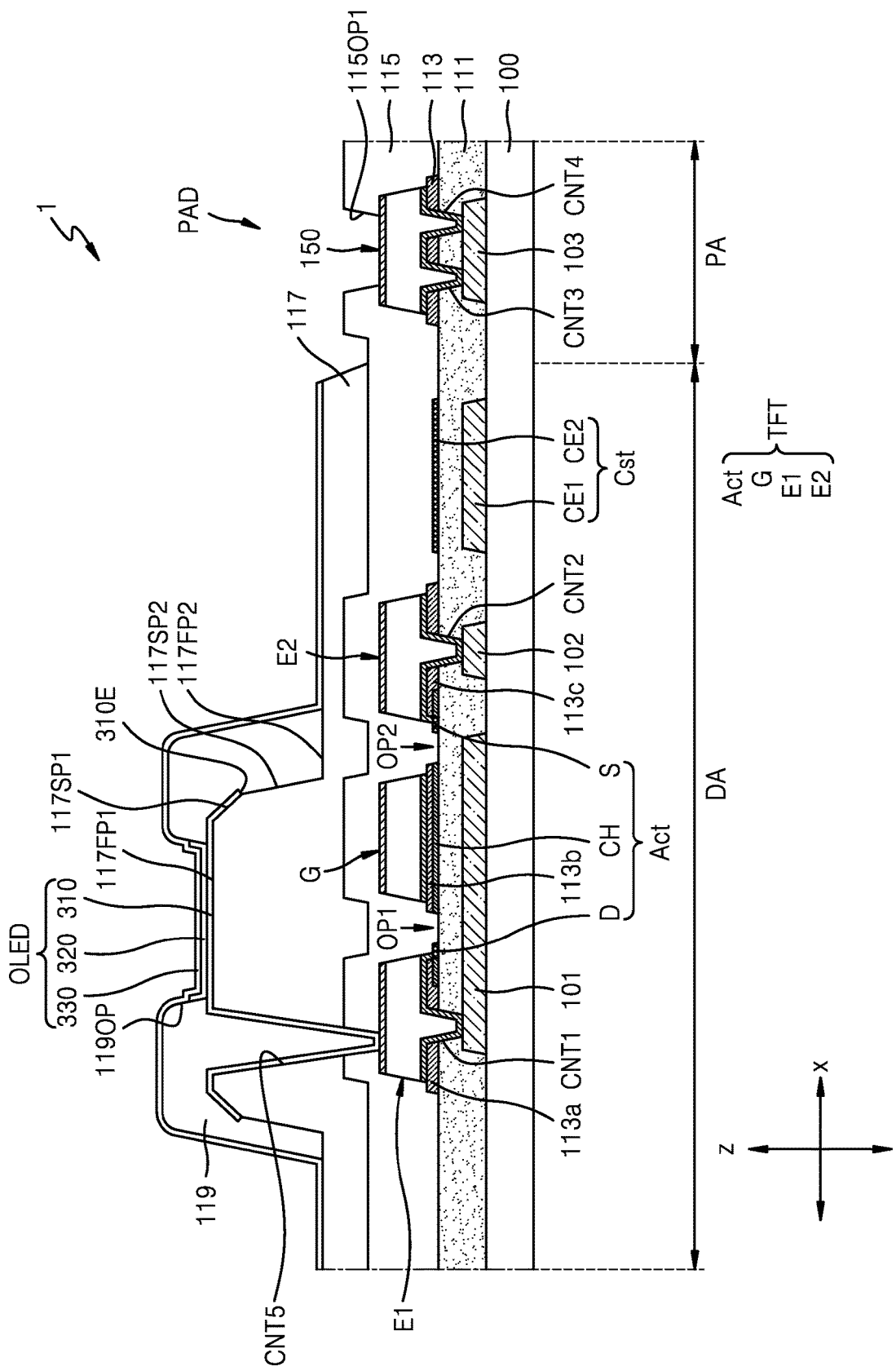
FIG. 9 is a schematic cross-sectional view of a display device according to another embodiment.

FIG. 9 is a schematic cross-sectional view of the display device according to another embodiment. FIG. 9 is a modified embodiment of the embodiment shown in FIG. 5, and is different from the embodiments described above in terms of the shape (or the structure) of the planarization layer 117. Hereinafter, differences in the planarization layer 117 shown in FIGS. 5 and 9 will be mainly described, and same descriptions thereof will be omitted.

Referring to FIG. 9, the top surface of the planarization layer 117 may include the first surface portion 117FP1, the first slope portion 117SP1, the second slope portion 117SP1, and the second surface portion 117FP2. Unlike in FIG. 5, the planarization layer 117 may not include the valley portion 117VY (see FIG. 5) arranged around the first electrode 310. The planarization layer 117 may not include the fourth surface portion 117FP4 (see FIG. 5) having a step with the second surface portion 117FP2. In an embodiment, the second surface portion 117FP2 may extend to the display area DA outside the first electrode 310. In an embodiment, the second surface portion 117FP2 may cover an entire portion of the display area DA outside the first electrode 310.

In this case, as the planarization layer 117 outside the first electrode 310 has a relatively small thickness, in processes of manufacturing the display device 1, for example, in a following process in which the planarization layer 117 is attached to an upper panel, the possibility that impurities entering an upper portion of the planarization layer 117 are likely cause cracks may be reduced.

FIGS. 10A to 10F are cross-sectional views a method of manufacturing a display device, according to another embodiment. More particularly, FIGS. 10A to 10F are cross-sectional views sequentially illustrating the method of manufacturing the display device, according to an embodiment. FIGS. 10A to 10F illustrate a modified embodiment of the embodiment shown in FIGS. 8D to 8J. Hereinafter, a process having differences including a process of forming the planarization layer 117 will be mainly described, and same descriptions as those of 8D to 8J will be omitted.

Figure 10A:
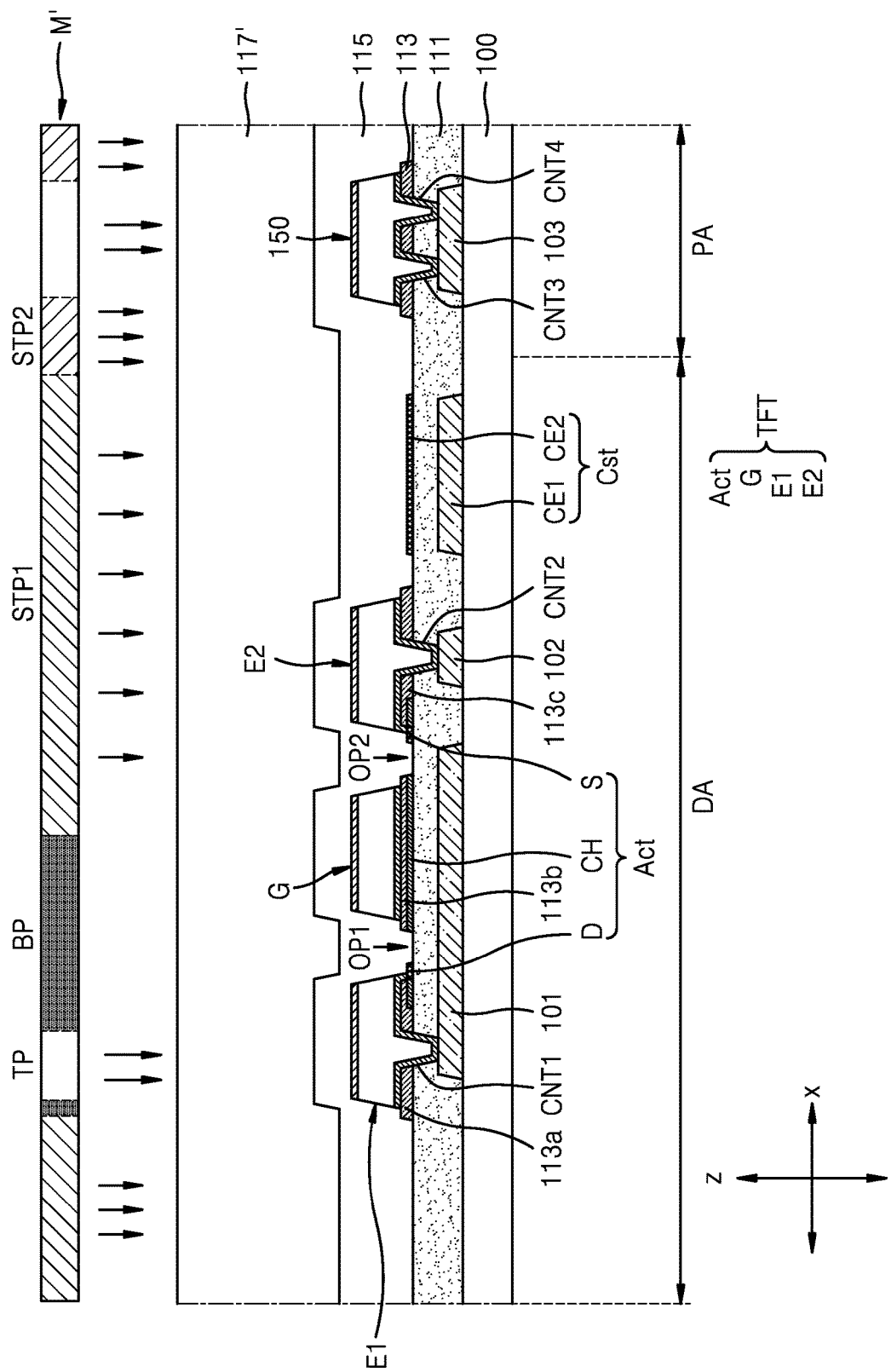
FIG. 10A to FIG. 10F are cross-sectional views showing a method of manufacturing a display device, according to another embodiment.

Referring to FIG. 10A, first, the first lower electrode 101, the second lower electrode 102, the first capacitor electrode CE1 of the storage capacitor Cst, the auxiliary pad electrode 103, the buffer layer 111, the semiconductor layer Act, the second capacitor electrode CE2 of the storage capacitor Cst, the gate insulating layer 113, the first upper electrode E1, the second upper electrode E2, the gate electrode G, and the inorganic insulating layer 115 may be sequentially formed. A process of forming from the first lower electrode 101, the second lower electrode 102, and the first capacitor electrode CE1 to the inorganic insulating layer 115 is identical to the process described above with reference to FIGS. 8A to 8D.

Referring to FIG. 10A, the preliminary planarization layer 117' may be formed on the inorganic insulating layer 115. The planarization layer 117, that is, the first insulating layer, may be formed by coating the preliminary planarization layer 117', and exposing and developing the preliminary planarization layer 117' using a fifth mask M'.

The fifth mask M' may include a half tone mask or a slit mask. The fifth mask M' may include a light-blocking portion BP, the first semi light-transmitting portion STP1, the second semi light-transmitting portion STP2, and the light-transmitting portion TP. The light-blocking portion BP, the first semi light-transmitting portion STP1, the second semi light-transmitting portion STP2, and the light-transmitting portion TP may be provided in plural numbers, respectively.

Referring to FIG. 8D, the first semi light-transmitting portion STP1 may have a relatively large width (or an area). For example, the portion of the preliminary planarization layer 117' exposed by the first semi light-transmitting portion of the fifth mask M' may include a portion corresponding to an entire portion of the display area DA outside the first electrode 310 including the edge of the first electrode 310 (see FIG. 10D) in a following process.

Figure 10B:
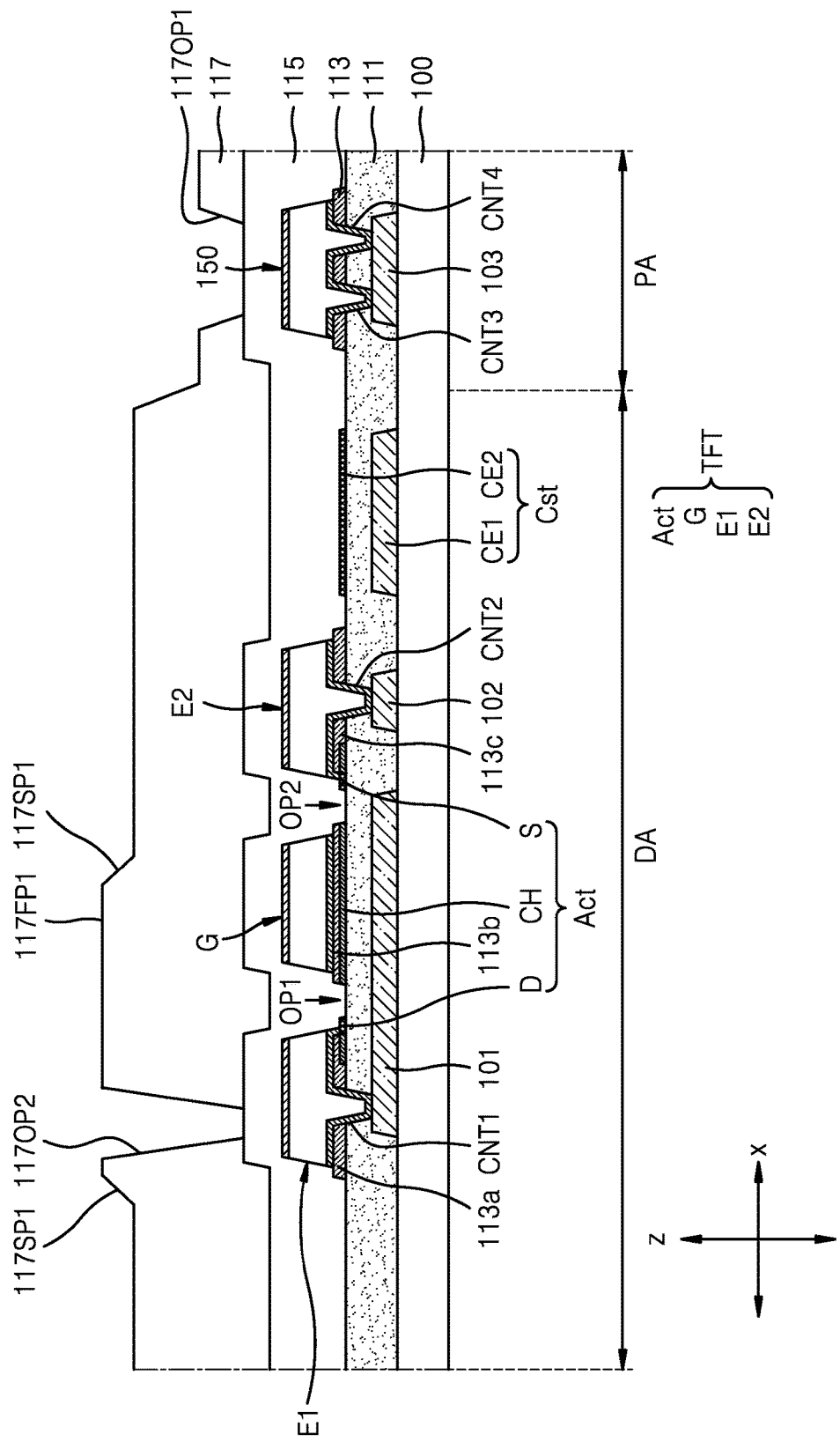

Referring to FIGS. 10A and 10B, the top surface of the planarization layer 117 corresponding to the portion of the preliminary planarization layer 117' exposed by the first semi light-transmitting portion STP1 of the fifth mask M' may include: the first surface portion 117FP1 that is relatively even; and the first slope portion 117SP1 inclining downward with respect to the first surface portion 117FP1. In a following process, the edge of the first electrode 310 (see FIG. 10D) may be arranged on the first slope portion 117SP1 of the planarization layer 117.

To correspond to the portion of the planarization layer 117 exposed by the light-transmitting portion TP of the fifth mask M', the planarization layer 117 may include: a first opening 117OP1 overlapping the pad electrode 150; and a second opening 117OP2 overlapping any one of the first upper electrode E1 and the second upper electrode E2.

Figure 10C:
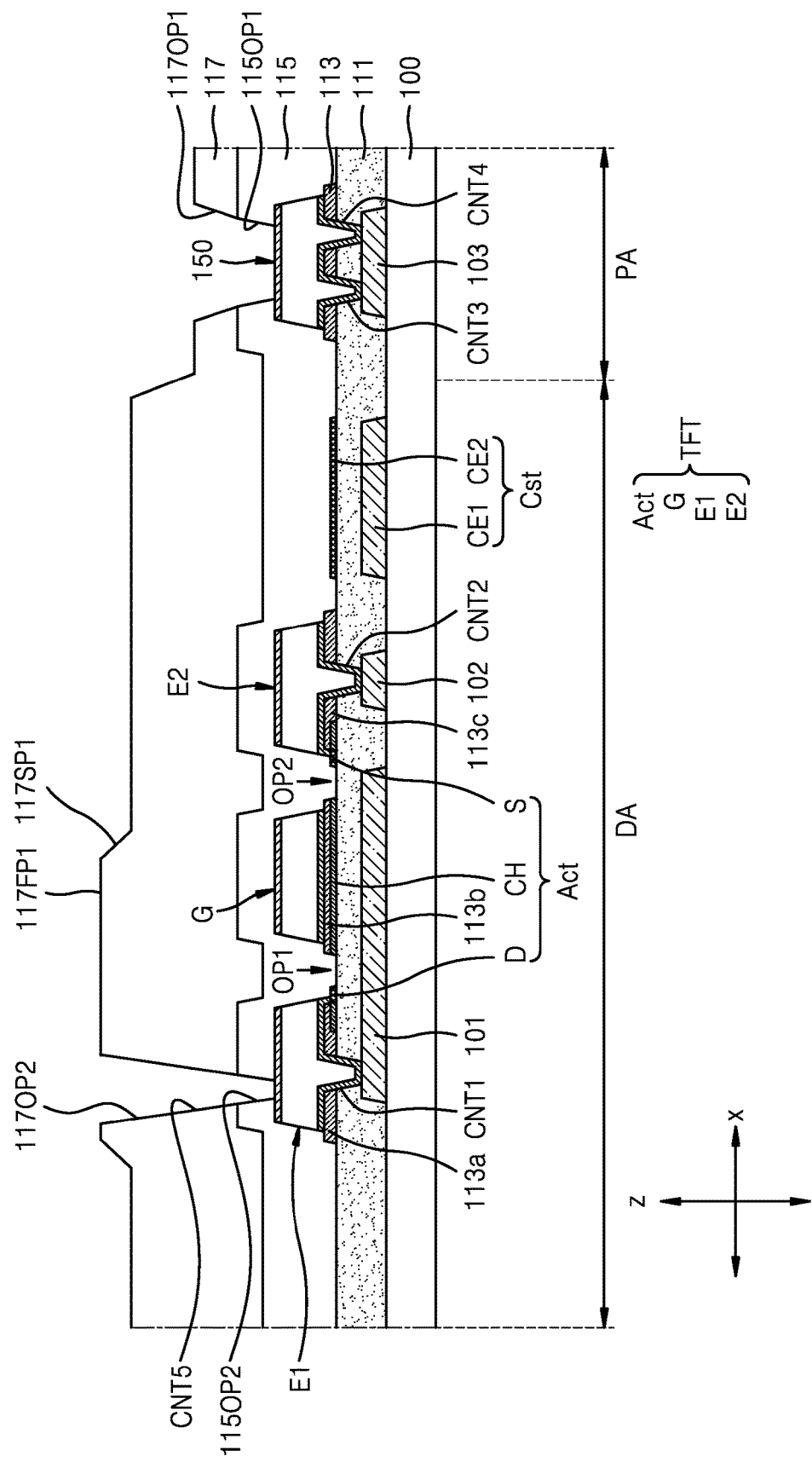
Figure 10D:
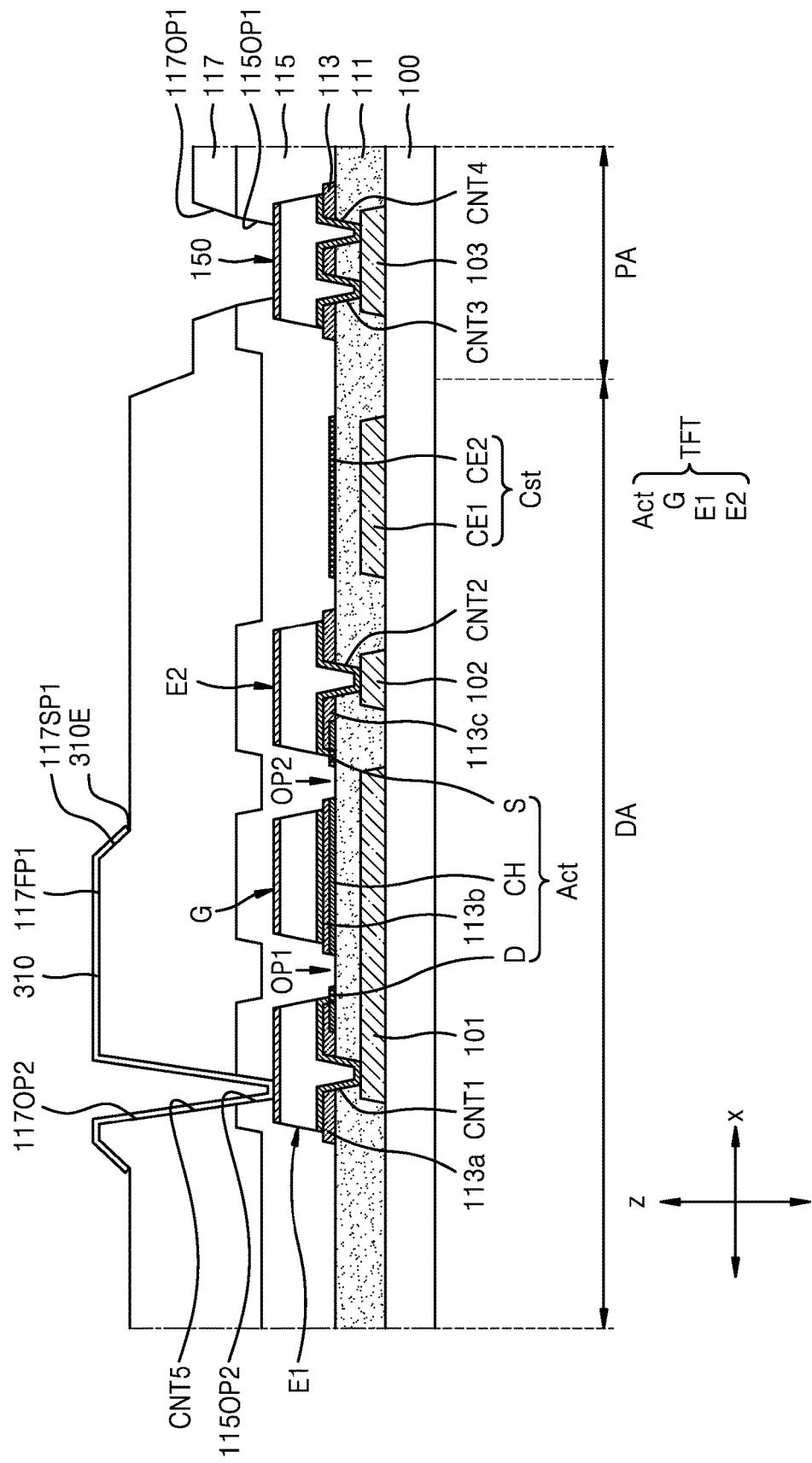

Referring to FIGS. 10C and 10D, the inorganic insulating layer 115 may be etched using the planarization layer 117. As portions of the inorganic insulating layer 115 are removed by an etching process, a first opening 115OP1 exposing the pad electrode 150 and a second opening 115OP2 exposing any one of the first upper electrode E1 and the second upper electrode E2 may be formed.

Referring to FIG. 10D, the first electrode 310 may be formed on the planarization layer 117. The first electrode 310 may be formed by etching the preliminary first electrode layer using the anode photoresist pattern (not shown) as an etch mask.

In an embodiment, the first electrode 310 may be formed on the first surface portion 117FP1 and the first slope portion 117SP1 of the planarization layer 117. For example, the edge 310E of the first electrode 310 may overlap with the first slope portion 117P1.

Figure 10E:
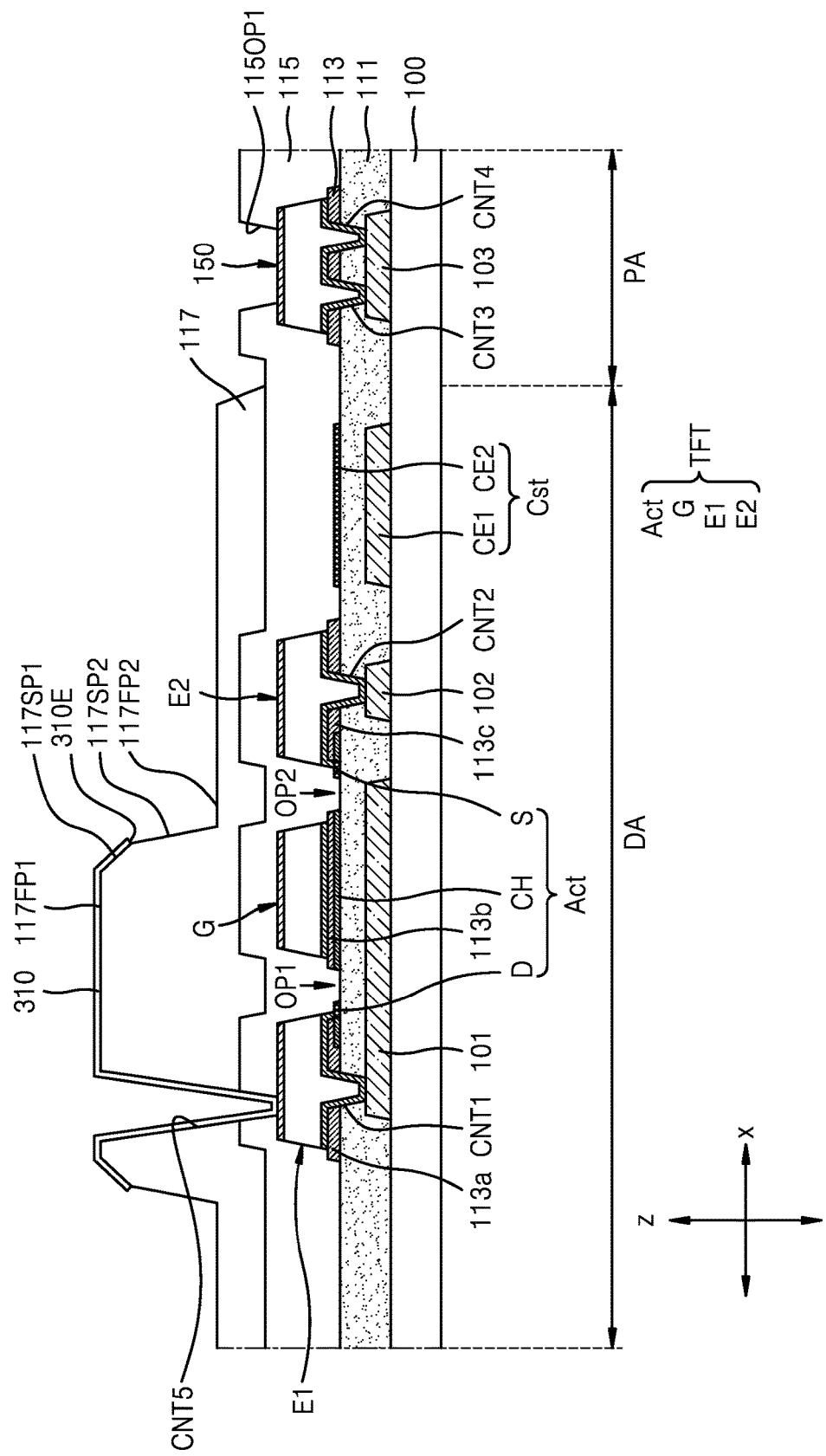

Referring to FIG. 10E, the planarization layer 117 may be partially removed when the anode photoresist pattern has not been removed. For example, the planarization layer 117 may be partially removed by using an ashing process in which oxygen gas is used.

By ashing, a portion of the planarization layer 117 arranged in the peripheral area PA may be removed. The planarization layer 117 may include an opening overlapping the peripheral area PA, for example, the pad portion PAD.

By ashing, a portion of the planarization arranged in the display area DA may be removed. The anode photoresist pattern, that is, the portion of the planarization layer 117 that does not overlap the first electrode 310, may be removed. The top surface of the planarization layer 117 that has undergone ashing process may include: the second surface portion 117FP2 having a step with the first surface portion 117FP1 with the first slope portion SP1 between the first surface portion 117FP1 and the second surface portion 117FP2; and the second slope portion 117SP2 between the first slope portion 117SP1 and the second slope portion 117FP2. The second slope portion 117SP2 may incline downward from the edge 310E of the first electrode 310.

In an embodiment, in the ashing process, the valley portion 117VY arranged along the edge of the first electrode 310 around the first electrode 310 may be not formed. In other words, the second surface portion 117FP2 may extend to the display area DA outside the first electrode 310. In an embodiment, the second surface portion 117FP2 may cover the entire portion of the display area DA outside the first electrode 310.

Figure 10F:
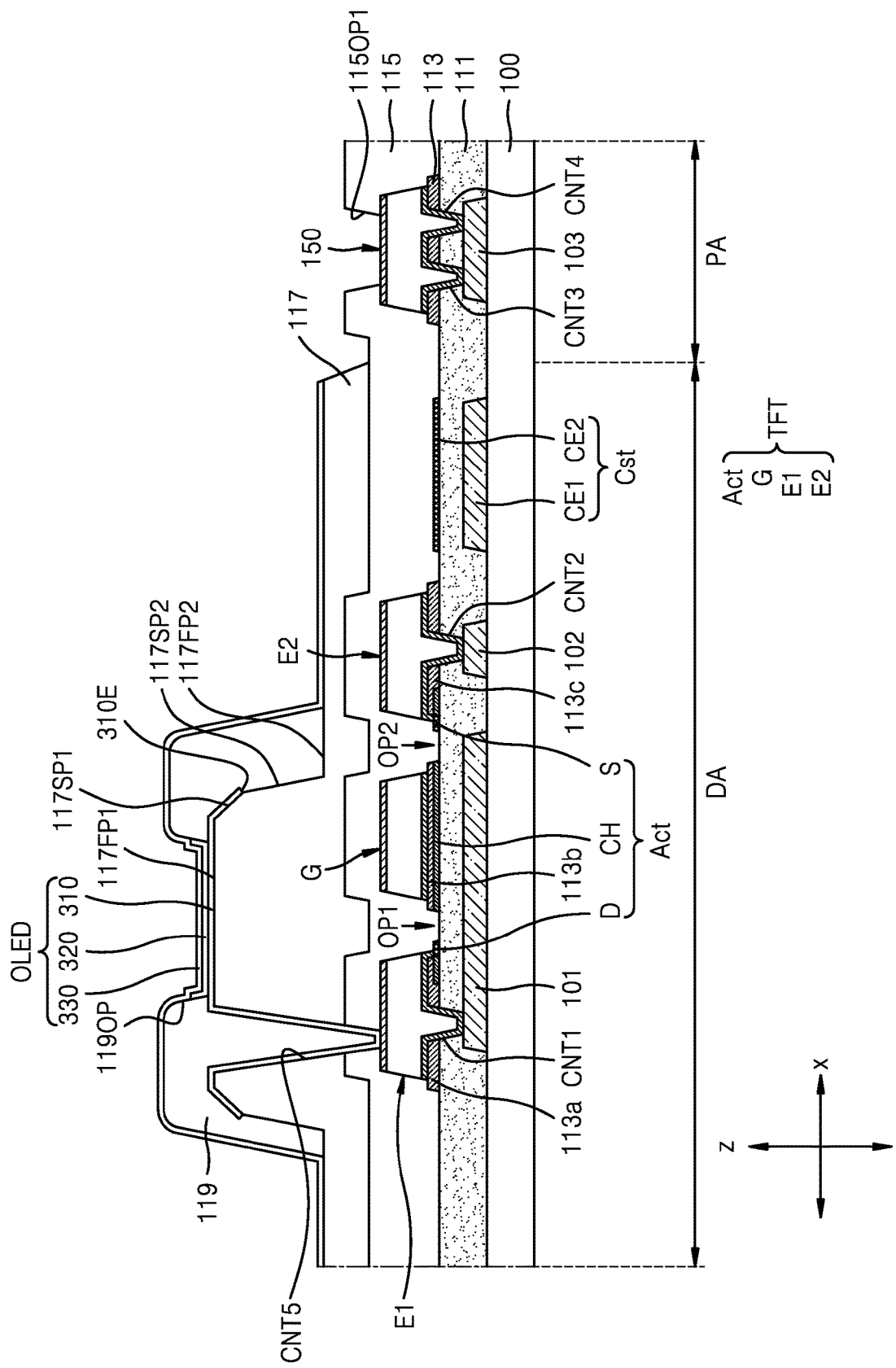

Referring to FIG. 10F, the bank layer 119 covering the edge 310E of the first electrode 310 may be formed on the first electrode 310. The opening 1190P exposing the center portion of the first electrode 310 may be formed in the bank layer 119. Subsequently, the emission layer 320 may be formed on the first electrode 310, in the opening 1190P of the bank layer 119. The second electrode 330 opposite to the first electrode 310 may be formed on the emission layer 320. The second electrode 330 may cover the display area DA of the substrate 100.

Figure 11:
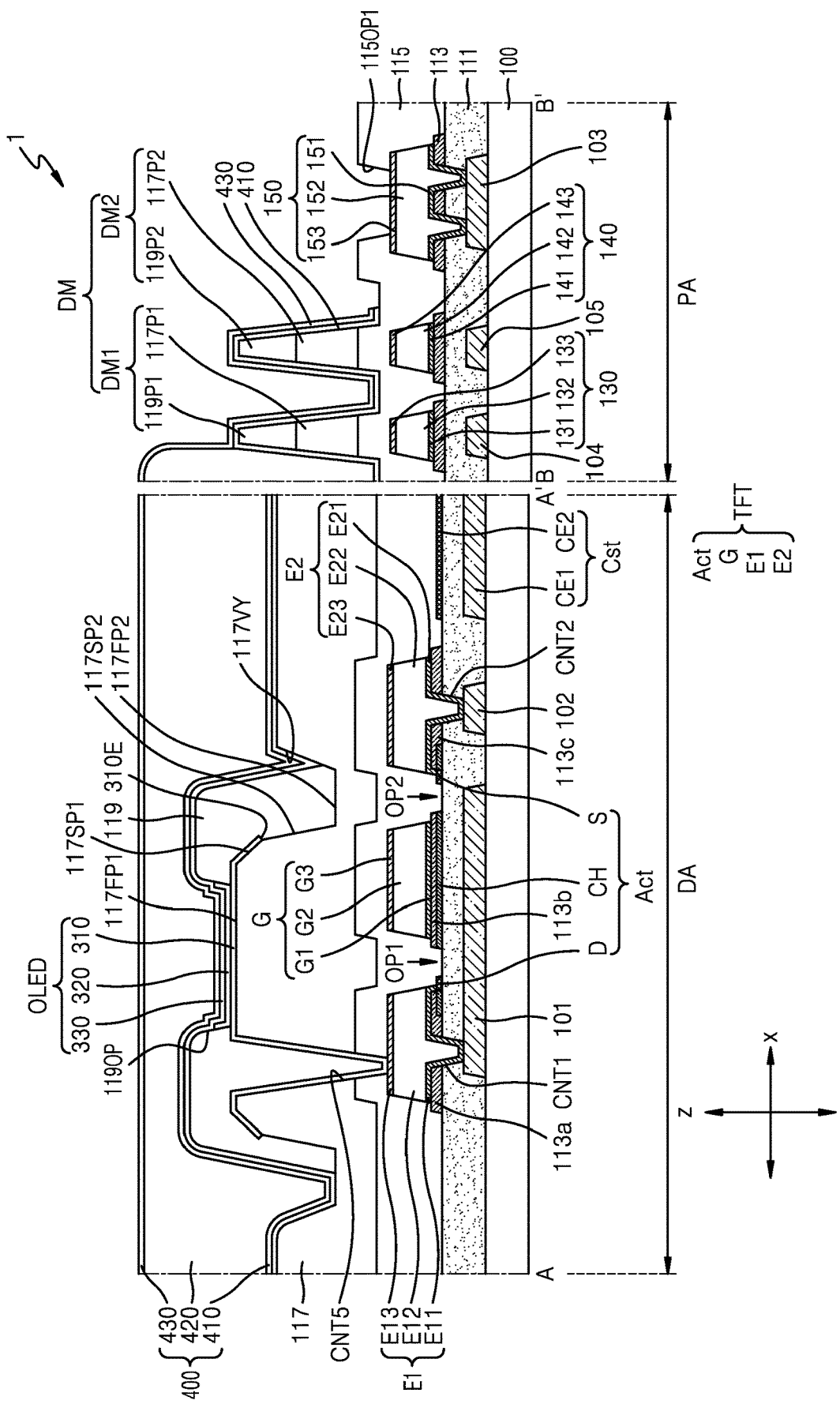
FIG. 11 is a schematic cross-sectional view of a display device according to an embodiment.

FIG. 11 is a schematic cross-sectional view of the display device according to an embodiment. FIG. 11 is a cross-sectional view taken along lines A-A' and B-B' shown in FIG. 1.

Referring to FIG. 11, the display device 1 includes the display area DA and the peripheral area PA. The substrate 100 may have areas corresponding to the display area DA and the peripheral area PA.

Referring to the display area DA shown in FIG. 11, the thin-film transistor TFT, the storage capacitor Cst, and the organic light-emitting diode OLED may be arranged on the substrate 100. Details thereof have been described with reference to FIG. 5.

The encapsulation layer 400 may be disposed on the organic light-emitting diode OLED. As the organic light-emitting diode OLED may be easily damaged by moisture or oxygen from outside, the encapsulation layer 400 may be arranged to cover and protect the organic light-emitting diode OLED. The encapsulation layer 400 covers the entire portion of the display area DA, and may extend toward the peripheral area PA to cover a portion of the peripheral area PA. The encapsulation layer 400 may include at least one inorganic encapsulation layer and at least one organic encapsulation layer. The encapsulation layer 400 may include a first inorganic encapsulation layer 410, a second inorganic encapsulation layer 430, and an organic encapsulation layer 420 disposed between the first inorganic encapsulation layer 410 and the second inorganic encapsulation layer 430.

The first inorganic encapsulation layer 410 and the second inorganic encapsulation layer 430 may each include at least one inorganic insulating material. The inorganic insulating material may include aluminum oxide, titanium oxide, tantalum oxide, hafnium oxide, zinc oxide, silicon oxide, silicon nitride, and/or silicon oxynitride. The organic encapsulation layer 420 may include a polymer-based material. The polymer-based material may include an acrylic resin, an epoxy-based resin, polyimide, polyethylene, and the like. For example, the organic encapsulation layer 420 may include an acrylic resin, for example, polymethylmethacrylate, polyacrylate, and the like. The organic encapsulation layer 420 may be formed curing a monomer or coating a polymer.

The buffer layer 111 and the inorganic insulating layer 115 may extend to the peripheral area PA.

A first dam DM1 and a second dam DM2 may be arranged on the inorganic insulating layer 115 corresponding to the peripheral area PA. The first dam DM1 and the second dam DM2 may surround the outside of the display area DA on a plane. For example, the first dam DM1 may surround the outside of the display area DA, and the second dam DM2 may surround the outside of the first dam DM1. The second dam DM2 may be arranged between the first dam DM1 and the pad portion PAD in which the pad electrode 150 is exposed.

The first dam DM1 and the second dam DM2 may prevent the organic encapsulation 420 of the encapsulation layer 400 from overflowing to the outside of the substrate 100. In the encapsulation layer 400, the first inorganic encapsulation layer 410 and the second inorganic encapsulation layer 420 may partially overlap the first dam DM1 and/or the second dam DM2.

The first dam DM1 and the second dam DM2 may each be provided in a multi-layer structure. For example, the first dam DM1 may include a portion 117P1 of the planarization layer 117 and a portion 119P1 of the bank layer 119. The second dam DM2 may include a portion 117P2 of the planarization layer 117 and a portion 119P2 of the bank layer 190. In other embodiments, some of the aforementioned layers may be omitted from the first dam DM1 and the second dam DM2.

In an embodiment, the first dam DM1 and the second dam DM2 may at least partially overlap a signal wiring and/or power supply line. For example, the first dam DM1 may overlap a first wiring 104 and a third wiring 130. The second dam DM2 may overlap a second wiring 105 and a fourth wiring 140. In an embodiment, each of the first wiring 104, the second wiring 105, the third wiring 130, and the fourth wiring 140 may each include any one of the voltage supply line or the signal wiring.

The first wiring 104 and the second wiring 105 may be arranged on a same layer and include a same material as the first lower electrode 101, the second lower electrode 102, and the first capacitor electrode CE1.

The third wiring 130 and the fourth wiring 140 may be arranged on a same layer and include a same material as the gate electrode G, the first upper electrode E1, and the second upper electrode E2. The third wiring 130 and the fourth wiring 140 may respectively include a plurality of sub-layers, that is, first layers 131 and 141, second layers 132 and 142 on the first layers 131 and 141, and third layers 133 and 143 on the second layers 132 and 142. The first layers 131 and 141, the second layers 132 and 142, and the third layers 133 and 143 of the third wiring 131 and the fourth wiring 140 may be respectively arranged on same layers and include same materials as the first layer G1, the second layer G2, and the third layer G3 of the gate electrode G.

As described above, a display device, by which defects of light-emitting devices may prevented with a reduced number of masks applied in a manufacturing process and improved productivity, and a method of manufacturing the display device, may be implemented. However, the scope of the disclosure is not limited thereto.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display device comprising:
   a substrate comprising a display area and a peripheral area outside the display area;
   a thin-film transistor arranged in the display area, the thin film transistor comprising a semiconductor layer and a gate electrode on the semiconductor layer;
   a first electrode electrically connected to the thin-film transistor;
   a bank layer covering an edge of the first electrode, and having an opening overlapping the first electrode;
   a second electrode on the first electrode;
   an emission layer between the first electrode and the second electrode; and
   a first insulating layer between the thin-film transistor and the first electrode,
   wherein a top surface of the first insulating layer comprises:
   a first surface portion overlapping the opening of the bank layer;
   a second surface portion having a vertical distance from the substrate smaller than a vertical distance from the substrate to the first surface portion;

a first slope portion between the first surface portion and the second surface portion, the first slope portion being inclined downward with respect to the first surface portion; and a second slope portion between the first slope portion and the second surface portion, the second slope portion being inclined downward from the edge of the first electrode.

2. The display device of claim 1, wherein an angle of the first slope portion with respect to a top surface of the substrate is less than an angle of the second slope portion with respect to the top surface of the substrate.

3. The display device of claim 1, wherein the first insulating layer comprises a valley portion arranged along the edge of the first electrode and around the first electrode.

4. The display device of claim 3, wherein the second slope portion comprises a side surface of the valley portion.

5. The display device of claim 1,
wherein a top surface of the first insulating layer further comprises
a third surface portion arranged between the first slope portion and the second slope portion, the third surface portion overlapping the first electrode.

6. The display device of claim 1, wherein a vertical distance from a top surface of a portion of the first electrode corresponding to the first slope portion to a top surface of the bank layer increases toward the edge of the first electrode.

7. The display device of claim 1, wherein the first insulating layer comprises an opening corresponding to the peripheral area.

8. The display device of claim 1, wherein the semiconductor layer comprises an oxide semiconductor material.

9. The display device of claim 1, further comprising an upper electrode overlapping and electrically connected to any one of a source area and a drain area of the semiconductor layer,
wherein the gate electrode overlaps a channel area of the semiconductor layer, and
the upper electrode is arranged on a same layer as the gate electrode.

10. The display device of claim 9, further comprising:
an inorganic insulating layer covering the gate electrode and the upper electrode, and
the first electrode directly contacts the upper electrode via a contact hole through the inorganic insulating layer and the first insulating layer.

11. A method of manufacturing a display device, the method comprising:
preparing a substrate comprising a display area and a peripheral area outside the display area;
forming a thin-film transistor on the display area;
forming, on the thin-film transistor, a first insulating layer having a top surface comprising a first surface portion and a first slope portion inclining downward with respect to the first surface portion, by using a mask;
forming a first electrode on the first insulating layer;
removing a portion of the first insulating layer to form a second surface portion having a vertical distance from the substrate less than a vertical distance from the substrate to the first surface portion;
forming a second slope portion between the first slope portion and the second surface portion, by removing a portion of the first insulating layer;
forming a bank layer covering an edge of the first electrode and having an opening overlapping the first surface portion;
forming an emission layer on the first electrode; and
forming a second electrode on the emission layer,
wherein the first slope portion is between the first surface portion and the second surface portion.

12. The method of claim 11, wherein the mask comprises a half tone mask or a slit mask.

13. The method of claim 11, wherein the second slope portion is inclined downward from an edge of the first electrode.

14. The method of claim 11, wherein the first slope portion and the second slope portion are formed in separate processes.

15. The method of claim 11, wherein the second slope portion is formed simultaneously with second surface portion.

16. The method of claim 11, the forming of the second surface portion comprises an ashing process.

17. The method of claim 11, further comprising removing a portion of the first insulating layer from the peripheral area.

18. The method of claim 11, further comprising forming a valley portion arranged along an edge of the first electrode and around the first electrode, by removing a portion of the first insulating layer.

19. The method of claim 18, wherein the forming of the valley portion of the first insulating layer is simultaneously performed with the forming of the second surface portion.

20. The method of claim 11, wherein an angle of the first slope portion with respect to a top surface of the substrate is less than an angle of the second slope portion with respect to the top surface of the substrate.

* * * * *